United States Patent
Purvis et al.

(10) Patent No.: US 11,266,002 B2
(45) Date of Patent: Mar. 1, 2022

(54) SYSTEM FOR MONITORING A PLASMA

(71) Applicant: ASML Netherlands B.V., Veldhoven (NL)

(72) Inventors: Michael Anthony Purvis, San Diego, CA (US); Klaus Martin Hummler, San Diego, CA (US); Chengyuan Ding, San Diego, CA (US); Robert Jay Rafac, Encinitas, CA (US); Igor Vladimirovich Fomenkov, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/756,185

(22) PCT Filed: Oct. 19, 2018

(86) PCT No.: PCT/EP2018/078689
§ 371 (c)(1),
(2) Date: Apr. 15, 2020

(87) PCT Pub. No.: WO2019/081364
PCT Pub. Date: May 2, 2019

(65) Prior Publication Data
US 2020/0344868 A1    Oct. 29, 2020

Related U.S. Application Data

(60) Provisional application No. 62/577,208, filed on Oct. 26, 2017.

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *G03F 7/7085* (2013.01)

(58) Field of Classification Search
USPC ...................................... 250/504 R
See application file for complete search history.

(56) References Cited

U.S. PATENT DOCUMENTS

| 6,855,943 B2 | 2/2005 | Shields |
| 7,491,955 B2 * | 2/2009 | Shiraishi ............... H05G 2/003 |
| | | 250/504 R |

(Continued)

FOREIGN PATENT DOCUMENTS

WO    2016146400 A1    9/2016

OTHER PUBLICATIONS

Wiebo van Toledo, European International Searching Authority, International Search Report and Written Opinion, corresponding PCT Application No. PCT/EP2018/078689, dated Mar. 1, 2019, 13 pages total.

(Continued)

*Primary Examiner* — Phillip A Johnston
(74) *Attorney, Agent, or Firm* — DiBerardino McGovern IP Group LLC

(57) ABSTRACT

An amplified optical beam is provided to a region that receives a target including target material, an interaction between the amplified optical beam and the target converting at least some of the target material from a first form to a second form to form a light-emitting plasma; first data comprising information related to the amplified optical beam is accessed; second data comprising information related to the light-emitting plasma is accessed; and an amount of the target material converted from the first form to the second form is determined. The determination is based on at least the first data and the second data, and the second form of the (Continued)

target material is less dense than the first form of the target material.

29 Claims, 11 Drawing Sheets

(56) References Cited

U.S. PATENT DOCUMENTS

| | | | | |
|---|---|---|---|---|
| 7,599,470 | B2* | 10/2009 | Kloepfel | H05G 2/005 378/119 |
| 8,704,200 | B2 | 4/2014 | Bykanov et al. | |
| 8,872,143 | B2* | 10/2014 | Rafac | H05G 2/005 250/504 R |
| 9,295,147 | B2* | 3/2016 | Bykanov | H05G 2/006 |
| 9,357,625 | B2* | 5/2016 | Tao | H05G 2/006 |
| 9,713,240 | B2* | 7/2017 | Riggs | H05G 2/003 |
| 9,832,852 | B1 | 11/2017 | Fomenkov et al. | |
| 2002/0018288 | A1 | 2/2002 | Rieger et al. | |
| 2005/0199829 | A1 | 9/2005 | Partlo et al. | |
| 2005/0205811 | A1 | 9/2005 | Partlo et al. | |
| 2006/0138311 | A1 | 6/2006 | Domke et al. | |
| 2008/0149862 | A1 | 6/2008 | Hansson et al. | |
| 2009/0046273 | A1 | 2/2009 | Bakshi et al. | |
| 2009/0218521 | A1 | 9/2009 | Sogard et al. | |
| 2013/0043401 | A1 | 2/2013 | Graham et al. | |
| 2013/0105712 | A1 | 5/2013 | Yanagida et al. | |
| 2014/0191132 | A1 | 7/2014 | Schafgans et al. | |
| 2014/0191133 | A1 | 7/2014 | Crouch et al. | |
| 2015/0189728 | A1 | 7/2015 | Tao et al. | |
| 2016/0007434 | A1 | 1/2016 | Tao et al. | |
| 2016/0147161 | A1 | 5/2016 | Nikipelov et al. | |
| 2017/0048959 | A1 | 2/2017 | Riggs et al. | |
| 2017/0181258 | A1 | 6/2017 | Ershov | |
| 2017/0280545 | A1 | 9/2017 | Tomita et al. | |

OTHER PUBLICATIONS

Tao et al. "Investigation on the interaction of long duration Nd:YAG laser pulse with Sn plasma for an EUV metrology source", Proc. of SPIE, vol. 7969; pp. 796930-1-796930-9 (2011).

* cited by examiner

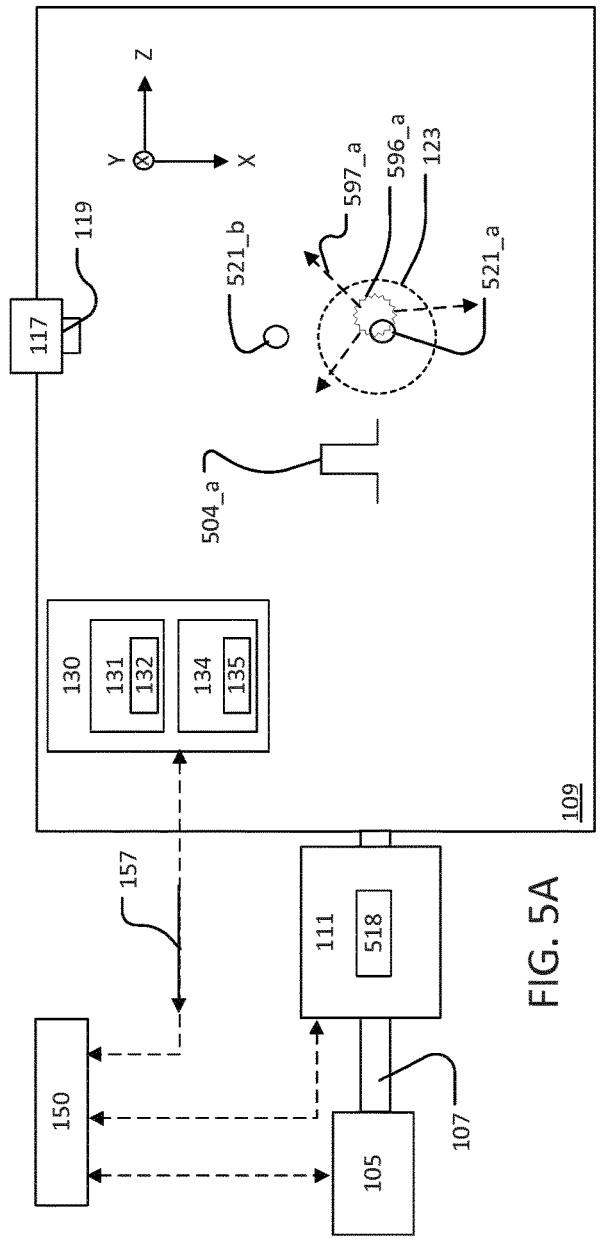
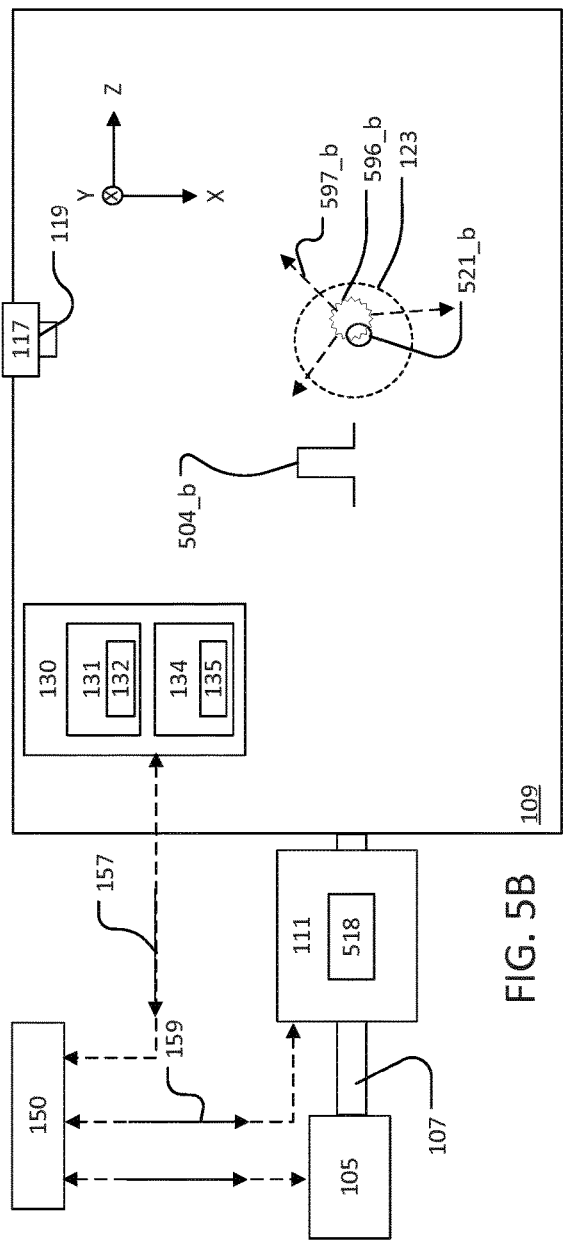
FIG. 5A
FIG. 5B

SYSTEM FOR MONITORING A PLASMA

CROSS-REFERENCE TO RELATED APPLICATIONS

This application claims priority of U.S. application 62/577,208, which was filed on Oct. 26, 2017, and which is incorporated herein in its entirety by reference.

TECHNICAL FIELD

This disclosure relates to techniques for monitoring a plasma. The techniques may be used in, for example, an extreme ultraviolet (EUV) light source.

BACKGROUND

Extreme ultraviolet ("EUV") light, for example, electromagnetic radiation having wavelengths of 100 nanometers (nm) or less (also sometimes referred to as soft x-rays), and including light at a wavelength of, for example, 20 nm or less, between 5 and 20 nm, or between 13 and 14 nm, may be used in photolithography processes to produce extremely small features in substrates, for example, silicon wafers, by initiating polymerization in a resist layer.

Methods to produce EUV light include, but are not necessarily limited to, converting a target material into a plasma that emits EUV light. The target material includes an element, for example, xenon, lithium, or tin, that has an emission line in the EUV range. In one such method, often termed laser produced plasma ("LPP"), the required plasma may be produced by irradiating a target that includes target material with an amplified optical beam that may be referred to as a drive laser. For this process, the plasma is typically produced in a sealed vessel, for example, a vacuum chamber, and monitored using various types of metrology equipment. The target material may be in the form of a droplet, plate, tape, stream, or cluster.

SUMMARY

In one general aspect, an amount of target material converted to a plasma is monitored. An amplified optical beam is provided to a region that receives a target including target material, an interaction between the amplified optical beam and the target converting at least some of the target material from a first form to a second form to form a light-emitting plasma; first data including information related to the amplified optical beam is accessed; second data including information related to the light-emitting plasma is accessed; and an amount of the target material converted from the first form to the second form is determined. The determination is based on at least the first data and the second data, and the second form of the target material is less dense than the first form of the target material.

Implementations may include one or more of the following features. The target material may include a metal, the first form may include the metal in a molten form, and the second form may include the metal in a vaporized form.

Either or both of a property of the amplified optical beam and a property of at least one subsequent target may be adjusted based on the determined amount of converted target material, the at least one subsequent target being received at the region after the target. The amplified optical beam may include a pulsed amplified optical beam, the pulsed amplified optical beam may include a plurality of pulses of light, and the light-emitting plasma may be formed by an interaction between one of the plurality of pulses of light and the target material. The one of the plurality of pulses of light may have a temporal duration, and the light-emitting plasma formed by the interaction between the one of the plurality of pulses of light and the target may emit light during a light-emission period.

The first data may include information representing a temporal duration of the one of the plurality of pulses of light, and the second data may include information representing a temporal duration of the light-emission period. Determining an amount of conversion of the target material may include: comparing the temporal duration of one of the plurality of pulses of light and the temporal duration of the light-emission period to determine a ratio of the temporal duration of the light-emission period to the temporal duration of one of the plurality of pulses; comparing the ratio to a threshold ratio, the threshold ratio being a value above which production of target debris is unacceptable; and determining whether the ratio is greater than the threshold ratio based on the comparison. In some implementations, if the ratio is greater than the threshold ratio, a property of a subsequent pulse in the amplified optical beam is adjusted or a source that produces the amplified optical beam is deactivated. In some implementations, if the ratio is greater than the threshold ratio, adjusting a property of a subsequent target, the subsequent target being received at the region after the target, or deactivating a source that produces the amplified optical beam. The property of the subsequent pulse may include one or more of a temporal duration, a temporal profile, an energy, and a focus location. The subsequent pulse may be the pulse that immediately follows the one of the plurality of pulses. The property of the subsequent target may include one or more of a shape, a density, a thickness, and a size.

The information related to the amplified optical beam may include information representing a property of the one of the plurality of pulses of light, the information related to the light-emitting plasma may include information representing a property of the light-emission period, determining an amount of conversion of the target material may include comparing the property of the one of the plurality of pulses of light and the property of the light-emission period, and the property of the one of the plurality of pulses of light and the property of the light-emitting plasma may include a rise time, a peak energy value, a total energy content, and/or an average energy content.

In some implementations, the first data includes data from a first sensor, the first sensor being configured to measure a property of the amplified optical beam and to generate the information related to the amplified optical beam based on the measured property of the amplified optical beam, and the second data includes data from a second sensor, the second sensor being configured to measure a property of the light-emitting plasma and to generate the information related to the light-emitting plasma based on the measured property of the light-emitting plasma.

Diagnostic data based on the on the determined amount of conversion of the target material may be presented.

A source of the amplified optical beam may be controlled based on the determined amount of conversion of the target material. Controlling the source of the amplified optical beam may include (a) deactivating the source, (b) changing an operating mode of the source, or (c) triggering an optimization routine in the source.

The second data may include information about extreme ultraviolet (EUV) light emitted from the light-emitting plasma.

Determining the amount of target material converted may include determining production of target debris and/or particulate debris, the target debris including target material in the first form and the particulate debris including target material in the second form.

In another general aspect, a system includes an optical source configured to emit an amplified optical beam; a vacuum chamber positioned to receive the amplified optical beam at a plasma formation location in an interior of the vacuum chamber; a target material supply system configured to provide a target including target material to the plasma formation location, where an interaction between the target and the amplified optical beam converts at least some of the target material to form a light-emitting plasma; a sensor system including: a first sensor configured to detect least one wavelength of the amplified optical beam and to produce a first signal, the first signal including information related to the amplified optical beam; a second sensor configured to detect at least some of the light emitted from the light-emitting plasma and to produce a second signal, the second signal including information related to the light-emitting plasma; and a control system coupled to the sensor system, the control system configured to determine an amount of conversion of the target material based on at least the first signal and the second signal.

Implementations may include one or more of the following features. The control system may be further configured to control one or more properties of the amplified optical beam based on the determined amount of conversion. The optical source may be configured to emit a pulsed amplified optical beam, the first signal may include information that indicates a temporal duration of a pulse of light emitted from the optical source, and the second signal may include information that indicates a duration of light emission from the plasma. The system also may include an optical modulator between the optical source and the target region, and the control system may be coupled to the optical modulator, and the control system may be configured to control a property of the amplified optical beam by controlling the optical modulator to thereby control a temporal duration of the amplified optical beam.

The control system may be coupled to the optical source, and the control system also may be configured to control the optical source based on the determined amount of conversion.

The system also may include a second optical source, the second optical source configured to emit a second optical beam. In operational use, the second optical beam irradiates the target to form a modified target, and the interaction between the amplified optical beam and the target may be an interaction between the amplified optical beam and the modified target. The property of the target may include one or more of a density, a size, a thickness, and a shape.

The control system may be coupled to the second optical source and may be further configured to control one or more properties of the second optical beam based on the determined amount of conversion. The properties of the second optical beam may include one or more of an energy, a temporal duration of a pulse, a temporal profile of a pulse, and a focus position.

The second sensor may include a sensing element configured to detect EUV light.

In another general aspect, a control system for an EUV optical source includes one or more electronic processors; and an electronic storage coupled to the one or more electronic processors, the electronic storage including instructions that, when executed, cause the one or more electronic processors to: access first data including information related to an amplified optical beam, the amplified optical beam being configured to interact with a target material in a target to form a light-emitting plasma in a vacuum vessel of the EUV optical source; access second data including information related to the light-emitting plasma; determine an amount of the target material converted from a first form of the target material to a second form of the target material in the interaction based at least on the first data and the second data; compare the determined amount of target material converted in the interaction to a threshold amount of conversion; and if the amount of target material converted in the interaction is less than the threshold amount of conversion, generate a command signal, the command signal being sufficient to control one or more of an optical source and an optical component.

Implementations of any of the techniques described above may include an EUV optical source, a sensor system, a method, a process, a device, or an apparatus. The details of one or more implementations are set forth in the accompanying drawings and the description below. Other features will be apparent from the description and drawings, and from the claims.

DRAWING DESCRIPTION

FIGS. 5A and 5B show the EUV light source of FIG. 1A at two different times.

FIG. 8 is an example of measured data related to burn-through.

DETAILED DESCRIPTION

Figure 1A:
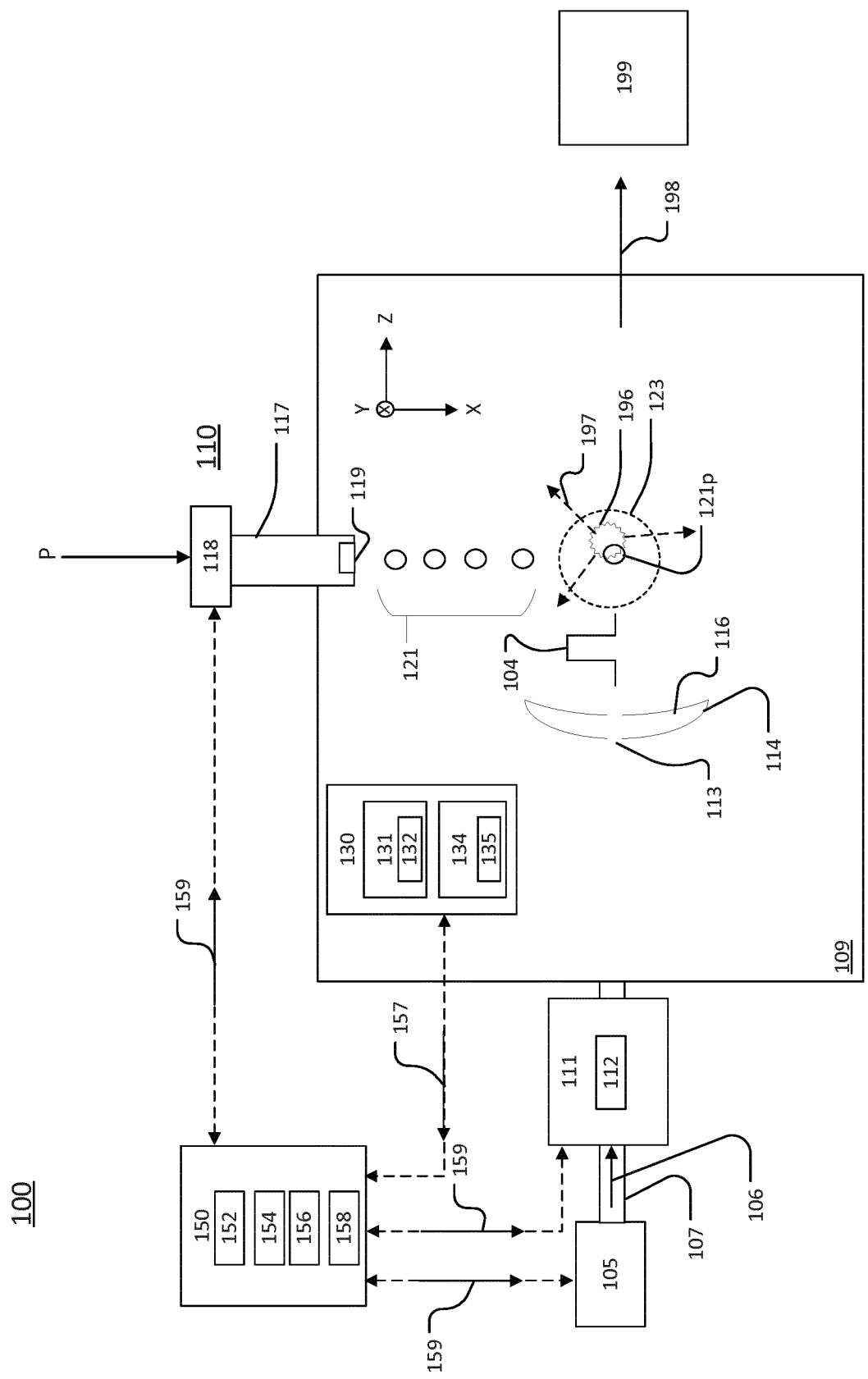
FIG. 1A is a block diagram of an example of an EUV light source.

Techniques for minimizing or reducing fuel debris production in a plasma-generating process are disclosed. The plasma may be generated by, for example, irradiating a fuel (or target material) with an optical beam that has sufficient energy to convert the fuel to plasma. The interaction between the optical beam and the fuel converts some or all of the fuel into plasma. Plasma includes fine or small particles collectively called plasma particles. The plasma particles may be, for example, vaporized, atomized, and/or ionized particles of the fuel. In other words, converting the fuel to form the plasma may generate fine or small particles of the fuel, and converting the fuel to form the plasma involves converting the fuel from its original form into another form. For example, fuel that is a molten metal in its original form may be converted to a vaporized metal to form the plasma. Fuel that is not converted in the plasma-generating process forms fuel debris, for example, microparticles of the fuel in its original form or pieces of fuel in the original form. The fuel debris is generally denser, larger, and/or heavier than the plasma particles. As such, it may be more challenging to mitigate or remove the fuel debris than the plasma particles.

Thus, the overall impact of debris may be reduced by increasing the amount or portion of fuel that is converted to the second form in the plasma-generating process. It may be desirable to reduce or eliminate the impact of fuel debris because fuel debris may negatively impact the performance of a system. For example, the presence of fuel debris may degrade optical components in the system or cause components to operate in a less-than-optimal manner. In addition to reducing the amount of fuel debris, increasing the amount or portion of fuel converted to plasma also may increase the amount of plasma and the amount of light emission.

As discussed below, the plasma and the optical beam are monitored to determine an amount of fuel converted to plasma during a plasma-generating event. Information gleaned from the monitoring may be used to control fuel debris production and thereby enhance debris mitigation. For example, properties of the optical beam and/or the fuel may be modified based on data collected during a plasma-generating event to increase the amount or relative portion of fuel that is converted in a subsequent plasma-generating event. In some implementations, the temporal profile of the optical beam that interacts with the fuel may be adjusted such that the optical beam is sufficiently long to ensure conversion of at least a threshold amount of the fuel or conversion of substantially all of the fuel. Alternatively or additionally, a property of the fuel may be modified such that the amount of fuel is matched to the optical beam in a manner that enhances conversion of the fuel. The techniques may be used in, for example, an EUV optical source. Monitoring the emission of EUV light from plasma may allow the temporal profile of the optical beam to be tailored to maximize EUV light production while also minimizing fuel debris.

Referring to FIG. 1A, a block diagram of an extreme ultraviolet (EUV) optical source 100 is shown. The EUV optical source 100 includes a sensor system 130 and a control system 150. The sensor system 130 monitors conversion of target material (fuel) in a target 121*p* during a plasma-generating event. The plasma-generating event arises from an interaction between a pulse 104 of an optical beam 106 and the target 121*p*. The control system 150 is configured to adjust one or more properties of a subsequent (later-occurring) pulse of the optical beam 106 and/or one or more properties of a subsequent target based on the monitoring.

Figure 1B:
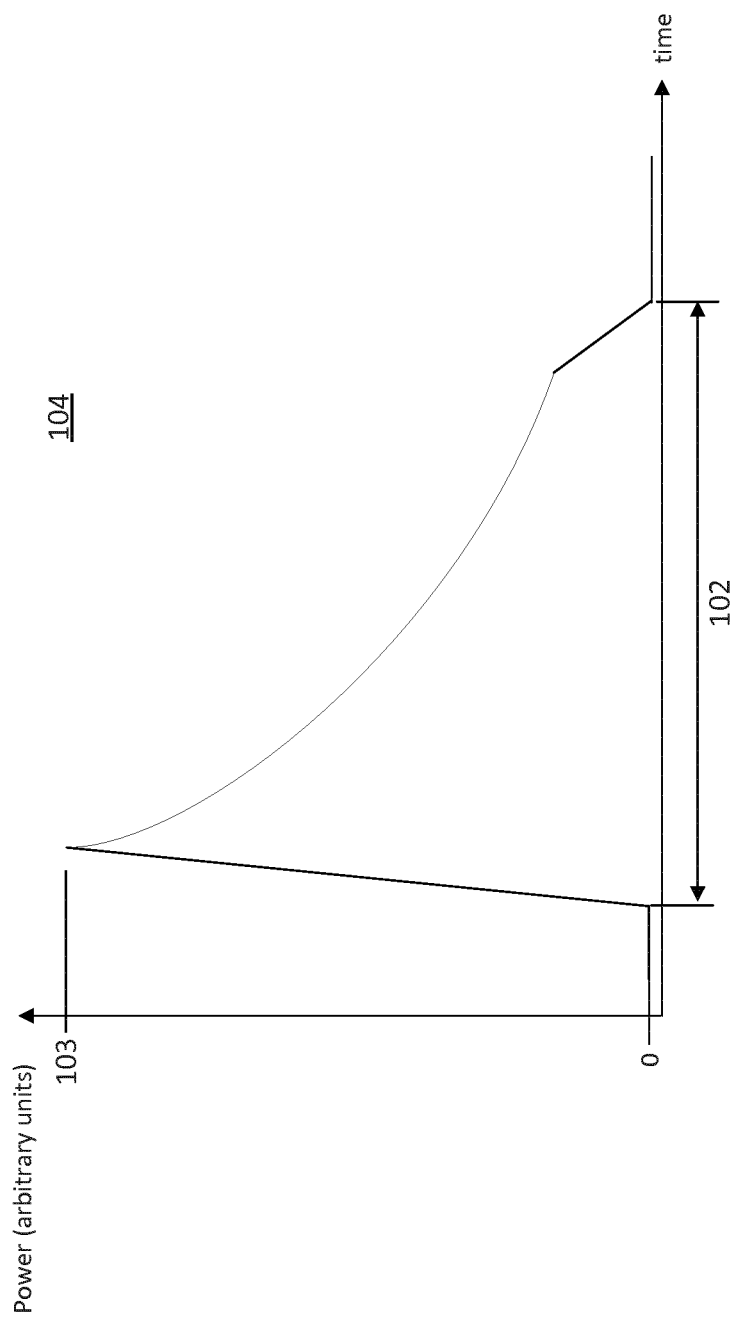
FIG. 1B is a plot of an example of a light pulse.

The optical beam 106 may be a train of pulses each of which is separated from the nearest pulse in time. FIG. 1B shows an example of a temporal profile (optical power as a function of time) of a pulse 104 within the train. The pulse 104 is an example of one of the pulses that may be part of the optical beam 106. An interaction between the pulse 104 and the target 121*p* in a plasma formation location 123 is a plasma-generating event.

The pulse 104 has a peak power 103 and a finite temporal duration 102. In the example of FIG. 1B, the pulse duration 102 is the time during which the pulse 104 has a non-zero power. The time for the pulse 104 to increase from zero to the peak power 103 is the rise time of the pulse. In other implementations, the pulse duration 102 and/or the rise time may be based on other metrics. For example, the pulse duration 102 may be less than the time during which the pulse 104 has a non-zero power, such as the full-width at half maximum (FWHM) of the pulse 104. Similarly, the rise time may be measured between two values other than zero optical power and the peak optical power 103.

The temporal profile shown in FIG. 1B is provided as an example, and other temporal profiles are possible. In the example shown, the power of the pulse 104 increases from zero power to the peak power 103 monotonically and decreases from the peak power 103 to zero monotonically. The pulses in the train of pulses that make up the optical beam 106 may have different temporal profiles. For example, the power of a pulse may increase from zero to the peak power non-monotonically. A pulse may have more than one peak energy point.

Referring again to FIG. 1A, the optical source 100 also includes a supply system 110 that emits a stream of targets 121 toward the plasma formation location 123 in a vacuum chamber 109. The supply system 110 includes a target formation apparatus 117, which defines an orifice 119. In operational use, the supply system 110 is fluidly coupled to a reservoir 118 that contains target material under pressure P. The target material may be considered to be a fuel. The pressure in the vacuum chamber 109 is much lower than the pressure P applied to the reservoir, and the target material that flows through the orifice 119 may be in a molten state. Target material emitted from the orifice 119 forms the stream of targets 121. The targets in the stream of targets 121 may be considered to be droplets of target material or targets. In the example of FIG. 1A, the stream of targets 121 travels from the orifice 119 to the plasma formation location 123 generally in the x direction.

The target material may be any material that emits EUV light when in a plasma state. For example, the target material may include water, tin, lithium, and/or xenon. The target material can be a target mixture that includes a target substance and impurities such as non-target particles. The target substance is the substance that, when in a plasma state, has an emission line in the EUV range. The target substance can be, for example, a droplet of liquid or molten metal, a portion of a liquid stream, solid particles or clusters, solid particles contained within liquid droplets, a foam of target material, or solid particles contained within a portion of a liquid stream. The target substance can be, for example, water, tin, lithium, xenon, or any material that, when converted to a plasma state, has an emission line in the EUV range. For example, the target substance can be the element tin, which can be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. Moreover, in the situation in which there are no impurities, the target material includes only the target substance.

The optical beam 106 is directed to the vacuum chamber 109 on an optical path 107 by a beam delivery system 111 that includes one or more optical components 112. The optical components 112 may include any components that are able to interact with the optical beam 106. The components 112 also may include devices that are able to form and/or shape the pulse 104. For example, the optical components 112 may include passive optical devices such as minors, lenses, and/or prisms, and any associated mechanical mounting devices and/or electronic drivers. These components may steer and/or focus the optical beam 106. Additionally, the optical components 112 may include components that modify one or more properties of the optical beam 106. For example, the optical components 112 may include active optical devices, such as acousto-optic modulators and/or electro-optic modulators, capable of changing the temporal profile of the optical beam 106 to form the pulse 104.

The pulse 104 leaves the beam delivery system 111 and enters the vacuum chamber 109. The pulse 104 passes through an aperture 113 of an optical element 114 to reach the plasma formation location 123. An interaction between the pulse 104 and the target material in the target 121p produces a plasma 196 that emits light 197. The emission of the light 197 occurs when the plasma is present at the plasma formation location 123. Thus, monitoring the presence of the light 197 also provides an indication of the presence or absence of the plasma 196.

The light 197 includes light with wavelengths that correspond to the emission lines of the target material. In the example of FIG. 1A, the light 197 includes EUV light 198, and the light 197 also may include out-of-band light. Out-of-band light is light at wavelengths not in the EUV light range. For example, the target material may include tin. In these implementations, the light 197 includes the EUV light 198 and also includes out-of-band light such as deep ultra-violet (DUV), visible, near infrared (NIR), mid-wavelength infrared (MWIR), and/or long-wavelength infrared (LWIR) light. The EUV light 198 can include light having a wavelength of, for example, 5 nanometers (nm), 5 nm-20 nm, 10 nm-120 nm, or less than 50 nm. The DUV light can include light having wavelengths between about 120 nm-300 nm, the visible light can include light having wavelengths between about 390 nm-750 nm, the NIR light can include light having wavelengths between about 750 nm-2500 nm, the MWIR light may have a wavelength between about 3000 nm-5000 nm, and the LWIR light may have a wavelength between about 8000 nm-12000 nm.

The optical element 114 may have a reflective surface 116 that is positioned to receive at least some of the light 197 and to reflect the light 197 to a lithography apparatus 199. The reflective surface 116 may have a coating that reflects the EUV light 198 but does not reflect out-of-band components of the light 197 or reflects only a nominal amount of the out-of-band components of the light 197. In this way, the reflective surface 116 directs only the EUV light 198 to the lithography apparatus 199.

The EUV optical source 100 also includes the sensor system 130, which provides a signal 157 that includes data related to the light 197 to the control system 150. The sensor system 130 includes a plasma monitoring module 134 that includes a sensor 135 capable of detecting one or more wavelengths of the light 197. The sensor 135 may be any sensor capable of detecting or sensing the presence of any of the wavelengths in the light 197. Thus, in the example of FIG. 1A, the sensor 135 may be a sensor capable of detecting EUV light or a sensor that is capable of detecting one or more wavelengths of out-of-band light.

The sensor system 130 also may include a beam-monitoring module 131 configured to provide data related to the pulse 104 to the control system 150. The beam-monitoring module 131 measures or determines one or more properties of the pulse 104. The properties of the pulse 104 may include, for example, the temporal duration, temporal profile, and/or a total energy. The beam-monitoring module 131 includes a sensor 132 that is capable of detecting wavelengths in the pulse 104. The sensor 132 and the sensor 135 are configured to detect different wavelengths of light such that the optical power of the pulse 104 and the optical power of the light 197 may be distinguished from each other. For example, the pulse 104 may have wavelengths in the NIR or MWIR, and the sensor 132 may include a filter such that the sensor 132 only detects these wavelengths. The sensor 135 is configured to detect different wavelengths or spectral bands that are not present in the optical beam 106. For example, the sensor 135 may be configured to detect EUV light or visible light.

In some implementations, the sensor system 130 does not include the beam-monitoring module 131. In these implementations, the control system 150 receives information about the optical beam 106 and/or the pulse 104 from the optical source 105 and/or the beam delivery system 111. Moreover, in some implementations, the sensor system 130 includes the beam-monitoring module 131 and the control system 150 is configured to receive information about the pulse 104 from any of the beam-monitoring module 131, the optical source 105, and the beam delivery system 111.

The EUV optical source 100 also includes the control system 150, which uses information from the sensor system 130, the optical source 105, and/or the beam delivery system 111 to monitor conversion of the target material in the target 121p. The control system 150 receives data from the sensor system 130 and also may receive data from the optical source 105 and/or the beam delivery system 111. The control system 150 also provides command signals 159, which are generated based on information about the optical beam 106 and the light-emitting plasma 196, to the optical source 105, the supply system 110, and/or the beam delivery system 111.

The control system 150 includes a determination module 152. The determination module 152 determines an amount of target material converted to the plasma 196. For example, the determination module 152 may receive data from the sensor 135 that indicates a length of time during which the light 197 is emitted. This time provides an indication of a length of time of the existence of the plasma 196. The determination module 152 also may receive data from the sensor system 130 and/or the optical source 105 indicating the temporal duration of the pulse 104.

The determination module 152 uses the information to determine an amount of conversion of target material in the target 121p. For example, the determination module 152 may compare the length of time during which the light 197 is emitted to the temporal duration of the optical pulse 104. If the temporal duration of the optical pulse 104 is greater than the time during which the light 197 was emitted, the determination module 152 may determine that all or substantially all of the target material in the target 121p was converted. The operation of the control system 150 and the determination module 152 is discussed further with respect to FIG. 3.

In the example of FIG. 1A, the determination module 152 of the control system 150 is implemented using an electronic processor 154, an electronic storage 156, and an I/O interface 158. The electronic processor 154 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processor 154 may be any type of electronic processor. The electronic processor 154 executes the instructions that make up the determination module 152.

The electronic storage 156 may be volatile memory, such as RAM, or non-volatile memory. In some implementations, and the electronic storage 156 includes non-volatile and volatile portions or components. The electronic storage 156 may store data and information that is used in the operation of the control system 150. For example, the electronic storage 156 may store the instructions (for example, in the form of a computer program) that implement the determination module 152. The determination module 152 receives information from the sensor system 130 and also may receive information from the optical source 105, the supply system 110, and/or the beam delivery system 111.

The electronic storage 156 also may store instructions, perhaps as a computer program, that, when executed, cause the electronic processor 154 to communicate with components in the optical source 105, the beam delivery system 111, the supply system 110, and/or the sensor system 130. For example, the instructions may be instructions that cause the electronic processor 154 to provide the command signal 159 generated by the determination module 152 to the optical source 105, the supply system 110, and/or the beam delivery system 111. The command signal 159 is a signal that causes a component in the optical source 105 and/or the beam delivery system 111 to act in a manner that adjusts the optical beam 106. For example, if the temporal duration of the optical pulse and the time during which the light 197 is emitted are substantially the same, the control system 150 may issue a command signal to the beam delivery system 111 to control an electro-optic modulator such that the next optical pulse that arrives at the plasma formation location 123 has a greater temporal duration and is able to convert a greater amount of target material than the prior optical pulse. In another example, the electronic storage 156 may store instructions that, when executed, cause the control system 150 to interact with a separate machine. For example, the control system 150 may interact with other EUV optical sources that are located in the same plant or facility.

The I/O interface 158 is any kind of interface that allows the control system 150 to exchange data and signals with an operator, the optical source 105, one or more components of the optical source 105, the lithography apparatus 199, and/or an automated process running on another electronic device. For example, in implementations in which the determination module 152 may be edited, the edits may be made through the I/O interface 158. The I/O interface 158 may include one or more of a visual display, a keyboard, and a communications interface, such as a parallel port, a Universal Serial Bus (USB) connection, and/or any type of network interface, such as, for example, Ethernet. The I/O interface 158 also may allow communication without physical contact through, for example, an IEEE 802.11, Bluetooth, or a near-field communication (NFC) connection.

Figure 2:
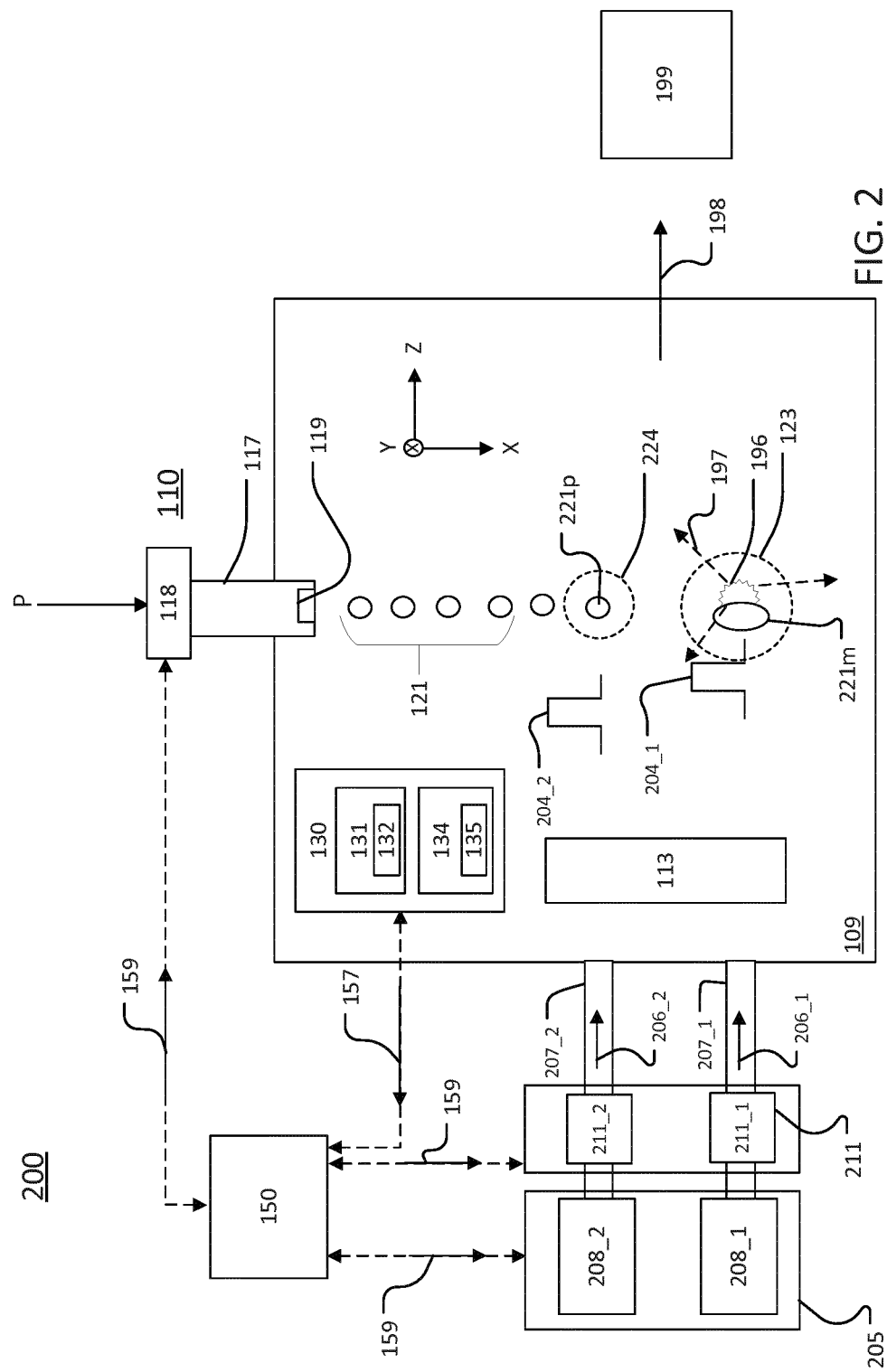
FIG. 2 is a block diagram of an example of an EUV light source.

Referring to FIG. 2, a block diagram of an EUV optical source 200 is shown. The EUV optical source 200 is another example of an implementation of an EUV optical source. The EUV optical source 200 is the same as the EUV optical source 100 (FIG. 1), except the EUV optical source 200 uses an optical source 205 that includes a first optical source 208_1, which emits a first optical beam 206_1, and a second optical source 208_2, which emits a second optical beam 206_2. A pulse 204_1 is a pulse of the first optical beam 206_1, and a pulse 204_2 is a pulse of the second optical beam 206_2. The pulse 204_2 may be referred to as a "pre-pulse" optical beam, and the pulse 204_1 may be referred to as a "main pulse" optical beam.

The EUV optical source 200 includes the optical element 114, but for simplicity only the aperture 113 of the optical element 114 is shown in FIG. 2. The pulse 204_2 propagates along a beam path 207_2, passes through the aperture 113 of the optical element 114, and is delivered to an initial target region 224 via a beam delivery system 211_2. The initial target region 224 receives an initial target 221$p$ from the supply system 110. The initial target region 224 is displaced in the −x direction relative to the plasma formation location 123.

The pulse 204_2 interacts with the target 221$p$ at the initial target region 224 to condition the target 221$p$ and form the modified target 221$m$. The conditioning may enhance the ability of the target 221$p$ to absorb the pulse 204_1. For example, although the light-emitting plasma 196 is not generally produced at the initial target region 224, the interaction between the pulse 204_2 and the target 221$p$ may change the shape, volume, and/or size of the distribution of the target material in the initial target 221$p$ and/or may reduce the density gradient of the target material along the direction of propagation of the main pulse 204_1. The modified target 221$m$ may be, for example, a disk-shaped distribution of target material that has a larger extent in the x-y plane than the target 221$p$ and a smaller extent along the z axis than the target 221$p$. The modified target 221$m$ drifts to the plasma formation location 123 and is irradiated by the pulse 204_1 to form the plasma 196.

The control system 150 is coupled to the optical source 208_2 and the beam delivery system 211_2 such that the control system 150 may be used to control the properties of the second optical beam 206_2 (or a pulse of the optical beam 206_2). In this way, the control system 150 may be used to control the parameters of the conditioning of the initial target 221$p$. The control system 150 is also coupled to the optical source 208_1 and the beam delivery system 211_1 and may be used to control the properties of the optical beam 206_1 (or a pulse of the optical beam 206_1).

The optical sources 208_1 and 208_2 may be, for example, two lasers. For example, the optical sources 208_1, 208_2 may be two carbon dioxide ($CO_2$) lasers. In other implementations, the optical sources 208_1, 208_2 may be different types of lasers. For example, the optical source 208_2 may be a solid state laser, and the optical source 208_1 may be a $CO_2$ laser. In the example of FIG. 2, the first and second optical beams 206_1, 206_2 are pulsed. The first and second optical beams 206_1, 206_2 may have different wavelengths. For example, in implementations in which the optical sources 208_1, 208_2 include two $CO_2$ lasers, the wavelength of the first optical beam 206_1 may be about 10.26 micrometers ($\mu$m) and the wavelength of the second optical beam 206_2 may be between 10.18 $\mu$m and 10.26 $\mu$m. The wavelength of the second optical beam 206_2 may be about 10.59 $\mu$m. In these implementations, the optical beams 206_1, 206_2 are generated from different lines of the $CO_2$ laser, resulting in the optical beams 206_1, 206_2 having different wavelengths even though both beams are generated from the same type of source.

The pulses 204_1 and 204_2 have different energies and may have different durations. For example, the pre-pulse 204_2 may have a duration of at least 1 s, for example, the pre-pulse may have a duration of 1-100 ns and a wavelength of 1 $\mu$m or 10 $\mu$m. In one example, the pre-pulse of radiation is a laser pulse that has energy of 15-60 mJ, a pulse duration of 20-70 ns, and a wavelength of 1-10 $\mu$m. In some examples, the pre-pulse may have a duration of less than 1 ns. For example, the pre-pulse may have a duration of 300 ps or less, 100 ps or less, between 100-300 ps, or between 10-100 ps.

The beam delivery systems 211_1 and 211_2 may be similar to the beam delivery system 111 (FIG. 1A). In the example of FIG. 2, the first optical beam 206_1 and the second optical beam 206_2 interact with separate beam delivery systems and travel on separate optical paths. However, in other implementations, the first optical beam 206_1 and the second optical beam 206_2 may share all or part of the same optical path and also may share the same beam delivery system.

Figure 3:
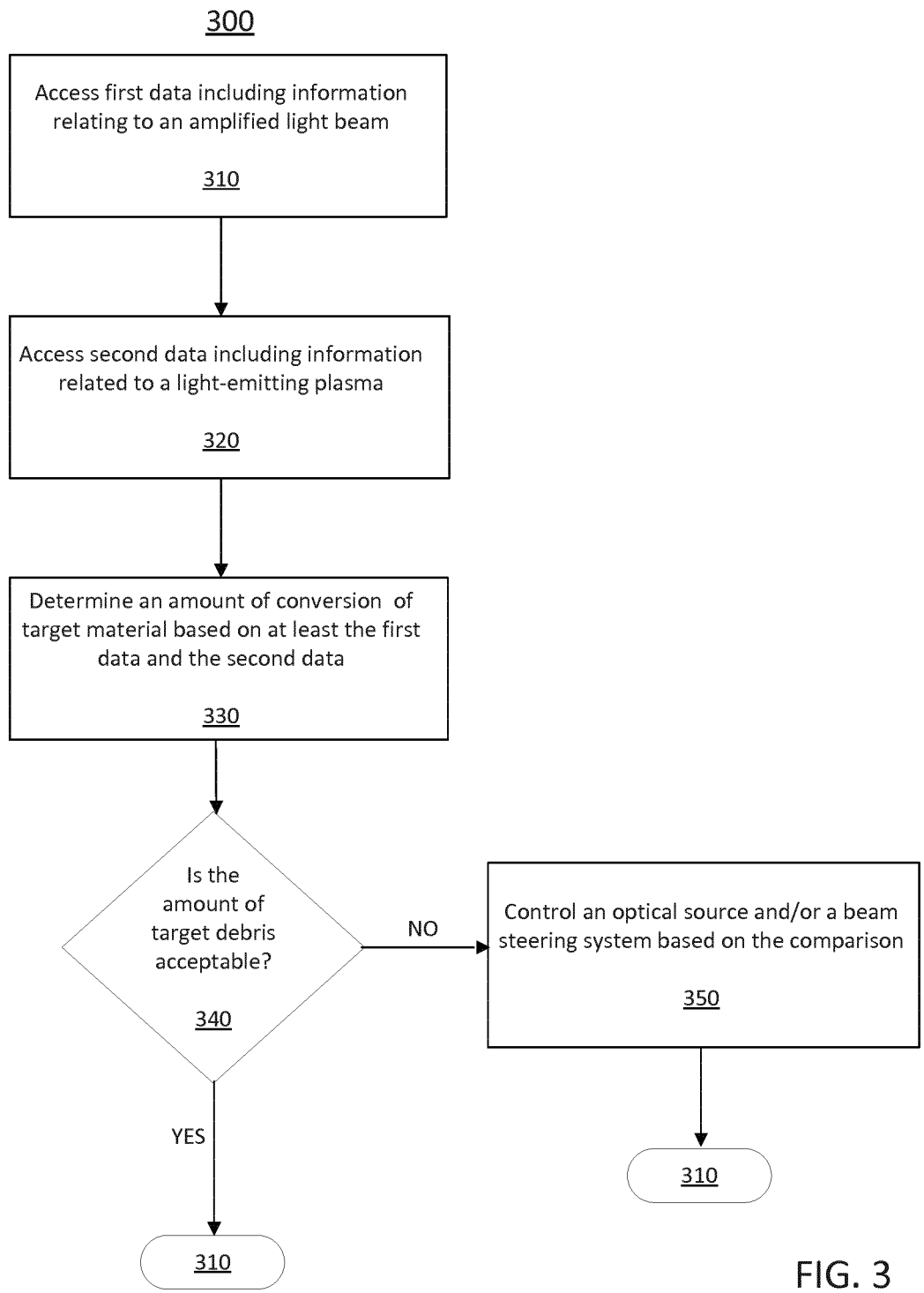
FIG. 3 is a flow chart of a process that may be used to monitor conversion of target material to light-emitting plasma.

FIG. 3 is a flow chart of a process 300. The process 300 is an example of an implementation of a process for monitoring conversion of target material to a light-emitting plasma. The process 300 may be used to monitor conversion of fuel (target material) in any system that forms plasma through an interaction between the fuel and an optical beam. The process 300 may be performed by the control system 150. The process 300 is discussed with respect to the EUV optical source 100 and then with respect to the EUV optical source 200.

The amplified optical beam 106 is provided to the plasma formation location 123 when the target 121p is in the plasma formation location 123 such that the optical pulse 104 of the amplified optical beam 106 and the target 121p interact. The interaction between the pulse 104 and the target 121p converts at least some of the target material in the target 121p to the plasma 196. First data is accessed (310). The first data includes information related to the pulse 104. For example, the first data may indicate the duration of the pulse 104. The first data may also indicate additional or other information related to the pulse 104. For example, the first data may include information that indicates a property of the pulse 104, such as, for example, the rise time, total energy content, and/or the peak energy value.

The control system 150 receives the first data and processes the first data to determine one or more properties of the pulse 104. The first data may be accessed from the sensor system 130. In these implementations, the first data is sensor data measured by the sensor 132. The sensor 132 may be any sensor that is capable of detecting light having wavelengths in the pulse 104. For example, in implementations in which the optical source 105 includes a carbon dioxide ($CO_2$) laser, the sensor 132 is a sensor that is capable of detecting wavelengths between, for example, 9-11 microns (µm), 10-11 µm, or 10.5-10.7 µm.

In some implementations, the first data is not accessed from the sensor system 130. For example, the first data may be accessed from the optical source 105 and/or the beam delivery system 111. In these implementations, the first data may be, for example, accessed from a controller that controls an electro-optic modulator that forms the temporal profile of the pulses in the beam 106. In this example, the first data may be data that includes information about an excitation signal applied to the electro-optic modulator to form the pulse 104. The control system 150 may determine or estimate the temporal profile and/or the rise time of the pulse 104 from the information about the applied excitation signal. In another example, the control system 150 may receive information from the optical source 105 about a firing pattern applied to generate pulses of light, and the beam-monitoring module 131 may estimate or determine a temporal duration of the pulse 104 from the information received from the optical source 105. In some implementations, the first data may be accessed from both the sensor system 130 and the optical source 105 and/or the beam delivery system 111.

Second data including information related to the light-emitting plasma 196 is accessed (320). The second data may be data from the plasma monitoring module 134 and the sensor 135. The sensor 135 may be any sensor or combination of sensors sensitive to the wavelengths of the light 197. The control system 150 determines one or more properties of the light-emitting plasma 196 from the second data. For example, the control system 150 may use the data from the sensor 135 to determine a temporal duration of the light 197. The temporal duration of the light 197 may be referred to as the light-emission period and provides an indication of the time period over which the plasma 196 is produced. The control system 150 may determine the light-emission period by processing the second data and applying one or more metrics to the second data. For example, the light-emission period may be defined as a continuous time during which the optical power detected by the sensor 135 is at least a threshold percentage of the maximum optical power detected by the sensor 135.

An amount of the target material converted to the plasma 196 is determined based at least on the first data and the second data (330). For example, the first data and the second data may be compared to determine the amount of target material converted to the plasma 196. As discussed above, the interaction between the pulse 104 and the target 121p produces the light-emitting plasma 196. In the process of producing the plasma 196, some or all of the target material in the target 121 is converted from a first form to a second form. The second form of the target material is generally less dense than the first form of the target material. The second form of the target material also may be lighter and/or smaller than the first form of the target material. The second form of the target material may be, for example, vaporized particles or atomized particles of target material.

Target material that is not converted to the second form is referred to as fuel debris or target debris. The fuel debris may accumulate on objects in the vacuum chamber 109, such as on the reflective surface 116 of the optical element 114. The accumulation of fuel debris on objects in the vacuum chamber 109 may thus cause performance degradation. Moreover, because the target material in the second form is less dense, the target material in the second form may be removed from the vacuum chamber 109 and/or mitigated through known cleaning techniques more readily than target material in the first form. As such, it is desirable to convert as much of the target material to the second form as possible. The process 300 monitors the plasma-generating process such that the amount of target debris may be controlled.

Because the plasma 196 is only produced when the target material is converted, the amount of target material converted (and thus the amount of fuel debris and the amount of plasma particles) in a plasma-generating event may be determined or approximated from the the first data (which has information about the pulse 104) and the second data (which has information about the light-emitting plasma 196). For example, the amount of target material converted may be determined based on comparing the first data and the second data.

To minimize or reduce the amount of target debris, the mass of the target material in the target should not be more than the optical pulse is able to convert to the light-emitting plasma 196. In particular, there is a correlation between debris production from the plasma-generation event and the degree of "burn through." Complete "burn through" generally occurs when the optical pulse used to irradiate the target material has a longer temporal duration than the emission period of the light emitted from the plasma. With a complete burn through, the light-emission period is within the temporal duration of the irradiating optical pulse, which indicates that all of the target material is converted and contributes to plasma production.

Figure 4:
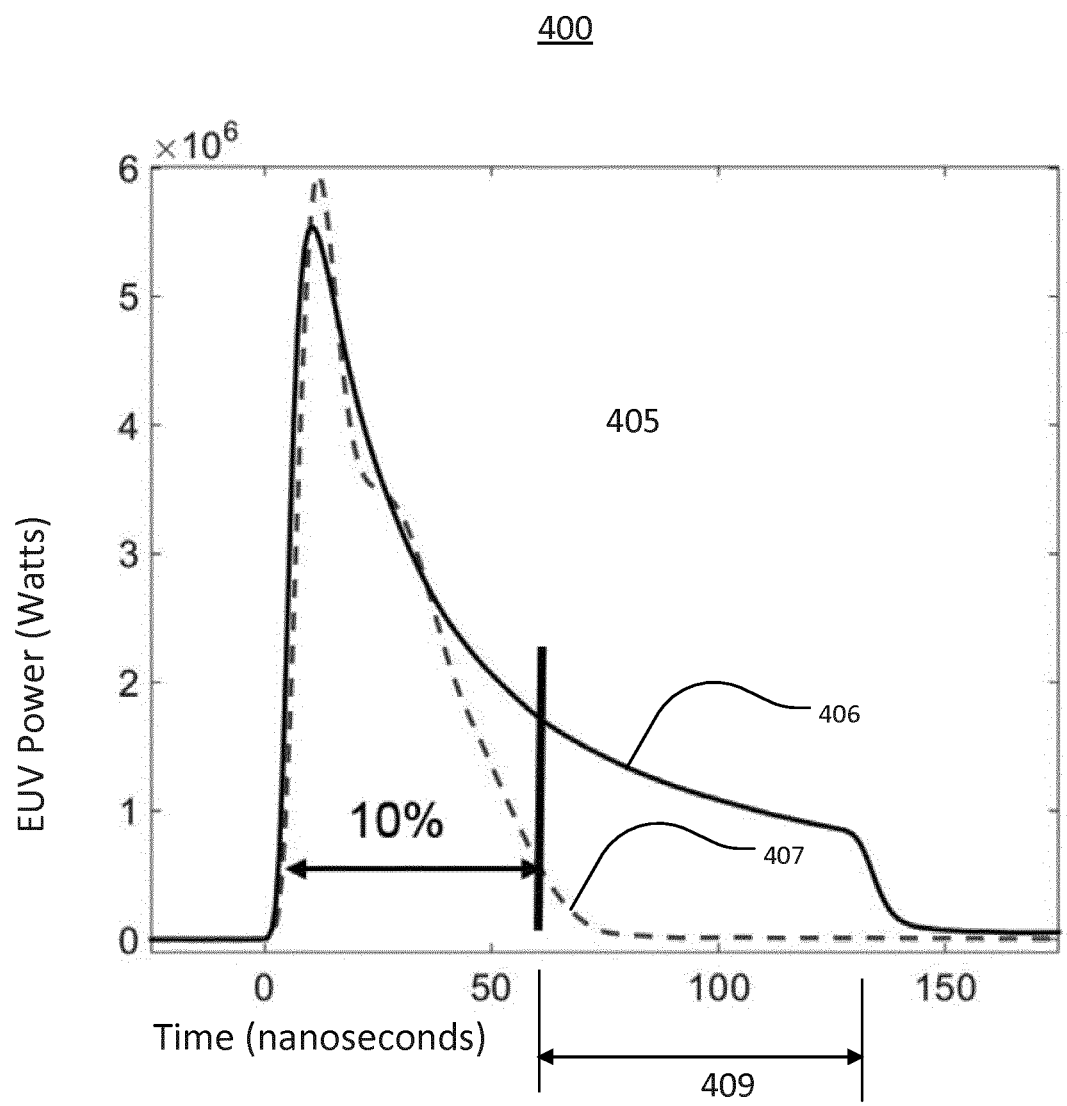
FIG. 4 is an example measured data related to a burn through time for a 22 µm droplet of target material.

A burn-through time is a time required for a complete burn through to occur. FIG. 4 shows an example of measured data related to a burn through time 405 for a 22 μm droplet of target material. In the example of FIG. 4, a trace 406 (solid line) represents the optical power of a pulse of the optical beam 106 as a function of time, and a trace 407 (dashed line) represents measured EUV light as a function of time. The trace 406 is the temporal profile of a pulse of light that interacts with target material to produce a plasma that emits the EUV light represented by the trace 407. In the example of FIG. 4, the end of the EUV light emission period occurs when the power of the detected EUV light drops to 10% of the peak value. A compensation value 409 may be used to set an amount of acceptable target debris in view of the threshold for determining the light-emission period, as discussed below.

Returning to FIG. 3, an amount of target material converted is determined based on the first data and the second data. For example, the first and second data may be compared to each other. Comparing the first data and the second data may include comparing a light-emission period of the light 197 (determined from the first data) and a temporal duration of the optical pulse (determined from the second data). In some implementations, the determination module 152 of the control system 150 may be implemented to assess the amount of target material converted to the second form based on the condition expressed in Equation 1:

$$t_{pulse} > t_{light} + \delta \qquad \text{Equation (1),}$$

where δ is a compensation value that is greater than or equal to zero, and $t_{light}$ is the temporal period over which the light 197 is emitted from the plasma 196, which is formed from the interaction of an optical pulse having a temporal duration of $t_{pulse}$.

Although burn through generally occurs when the optical pulse is longer than the time duration of the light 197, in an operational system such as the EUV optical source 100, sensor calibrations, thresholds used to determine when the optical pulse 104 and the emission of the light 197 end, and operating conditions may result in the burn-through time not coinciding with equal temporal durations of the light 197 and the optical pulse 104. The compensation value δ may be used to account for these operating conditions and may be used to set an acceptable amount of target debris. The compensation value δ may be pre-set for a particular system and/or may be determined during operation from experimental data. The compensation value δ may change during operation of the system as system conditions change. Moreover, the compensation value δ may be set such that an amount of burn through that is known or determined to be sufficient for a particular situation but is less than a complete burn through occurs. Thus, the compensation value δ may be used to set the acceptable amount of fuel debris.

Other metrics may be used in the comparison of the temporal duration of the pulse 104 to the temporal duration of the light 197. For example, a ratio may be used as shown in Equation (2):

$$\frac{t_{light}}{t_{pulse}} \leq debris_{th}, \qquad \text{Equation (2)}$$

where $debris_{th}$ is a threshold value that corresponds to an acceptable amount of target debris for the system and the operating conditions, $t_{light}$ is the temporal period over which the light 197 is emitted from the plasma 196, which is formed from the interaction of the pulse 104, and $t_{pulse}$ is the temporal duration of the pulse 104. The threshold value $debris_{th}$ may be set based on data measured from the system, and the threshold value $debris_{th}$ may change during operation of the system. When the ratio expressed in Equation 2 is equal to 1, the temporal duration of the light 197 and the temporal duration of the pulse 104 are equal. A ratio less than 1 indicates that the duration of the pulse 104 is greater than the duration of the light 197, and thus it is more likely that a burn-though condition occurred.

Equation 1 and Equation 2 are provided as examples of how the properties of the pulse 104 and the properties of the light 197 may be compared to assess an amount of conversion of the target material. Other comparisons are possible. For example, the rise time and/or the total energy may be used as the property to compare instead of the temporal duration.

Whether or not the amount of target debris is acceptable is determined (340). When the condition expressed in Equation 1 or the condition expressed in Equation 2 is true, the amount of target material converted is sufficient and, thus, the amount of target debris produced in the interaction between the pulse 104 and the target 122p is within an acceptable level of target debris. In this case, the control system 150 does not provide the command signal 159 to the optical source 105, the beam delivery system 111, or the target supply system 110. Thus, the properties of the next optical pulse of the optical beam 106 and the next target to reach the plasma formation location 123 are substantially the same as the pulse 104 and the target 122p.

The condition of Equation 1 or the condition of Equation 2 being false indicates that an insufficient amount of the target material was converted in the interaction between the pulse 104 and the target 122p and the target debris exceeds a desired amount. In response to determining that an insufficient amount of the target material was converted in the interaction between the pulse 104 and the target 122p, the control system 150 controls the optical source 105 (FIG. 1A) or the optical source 205 (FIG. 2), the beam delivery system 111, and/or the target supply 110. To control any of these subsystems of the EUV optical source 100, the control system 150 generates one or more command signals 159 and provides the command signals 159 to the subsystem being controlled. Providing the one or more command signals 159 to the controlled subsystem results in one or more properties of a subsequent pulse and/or a subsequent target being adjusted. An example of controlling one or more subsystems of the EUV optical source to control the properties of a subsequent pulse and/or target is discussed with respect to FIGS. 5A and 5B.

FIGS. 5A and 5B show the EUV optical source 100 at two different times, with FIG. 5A showing the EUV optical source 100 at a time t1, and FIG. 5B showing the EUV optical source 100 at a time t2, which is after the time t1. At the time t1, a pulse 504_a of the optical beam 106 arrives in the plasma formation location 123 and irradiates a target 521_a to produce a light-emitting plasma 596_a. The light-emitting plasma 596_a emits light 597_a over a first light-emission period. At the time t2, a subsequent pulse 504_b arrives in the plasma formation location 123 and irradiates a subsequent target 521_b to produce a light-emitting plasma 596_b. The plasma 596_b emits light 597_b over a second light-emission period. The first and second light-emission periods may be the same duration or may be different, depending on whether or not a command signal 159 was issued to control one or more of the subsystems of the EUV optical source 100.

The subsequent pulse 504_b and the subsequent target 521_b may be any pulse or any target, respectively, that arrive in the plasma formation location 123 after the pulse 504_a and the target 521_a. The subsequent pulse 504_b may be the pulse that immediately follows the pulse 504_a, and the subsequent target 521_b may be the target that is in the plasma formation location 123 immediately after the target 521_a.

The command signal 159 is based on the determination of an amount of conversion of target material (330). For example, if Equation 1 is used in the determination of (330), the sum of the light-emission period of the light 597_a and the compensation value δ being greater than or equal to the temporal duration of the pulse 504_a indicates that an insufficient amount of target material was converted in the interaction. The value of the difference between the temporal duration of the pulse 504_a and the temporal duration of the light 597_a indicates the amount of adjustment that the control system 150 should make. In particular and referring again to Equation 1, the temporal duration of the subsequent pulse 504_b should have a temporal duration that is δ more than the light-emission period of the light 597_a. Thus, in this example, the command signal 159 includes information that, when applied to one or more components of a subsystem of the EUV optical source 100, causes the subsequent pulse 504_b to have a temporal duration that is δ more than the duration of the light 597_a.

For example, the command signal 159 may be provided to a shutter 518 positioned on the beam path 107 in the beam delivery system 111. The shutter may be, for example, an electro-optic modulator (EOM) or an acousto-optic modulator (AOM). When the shutter 518 is in a first state, the beam 106 interacts with the shutter to form an optical pulse that propagates to the plasma formation location 123. When the shutter 518 is in a second state, the optical beam 106 does not remain on the optical path 107 and/or an optical pulse is not formed. In this example, the command signal 159 includes information that indicates that the shutter 518 should remain in the first state for an amount of time that causes the duration of the subsequent pulse 504_b to have a temporal duration δ more than the light-emission period of the light 197.

The command signal 159 also may be used to adjust a property of a subsequent target, such as the target 521_b. An example of adjusting a property of a subsequent target is discussed with respect to the EUV optical source 200 of FIG. 2. Examples of the impact of the size of the modified target and droplet size are discussed prior to providing an example of adjusting a property of a subsequent target using the EUV optical source 200.

Figure 6:
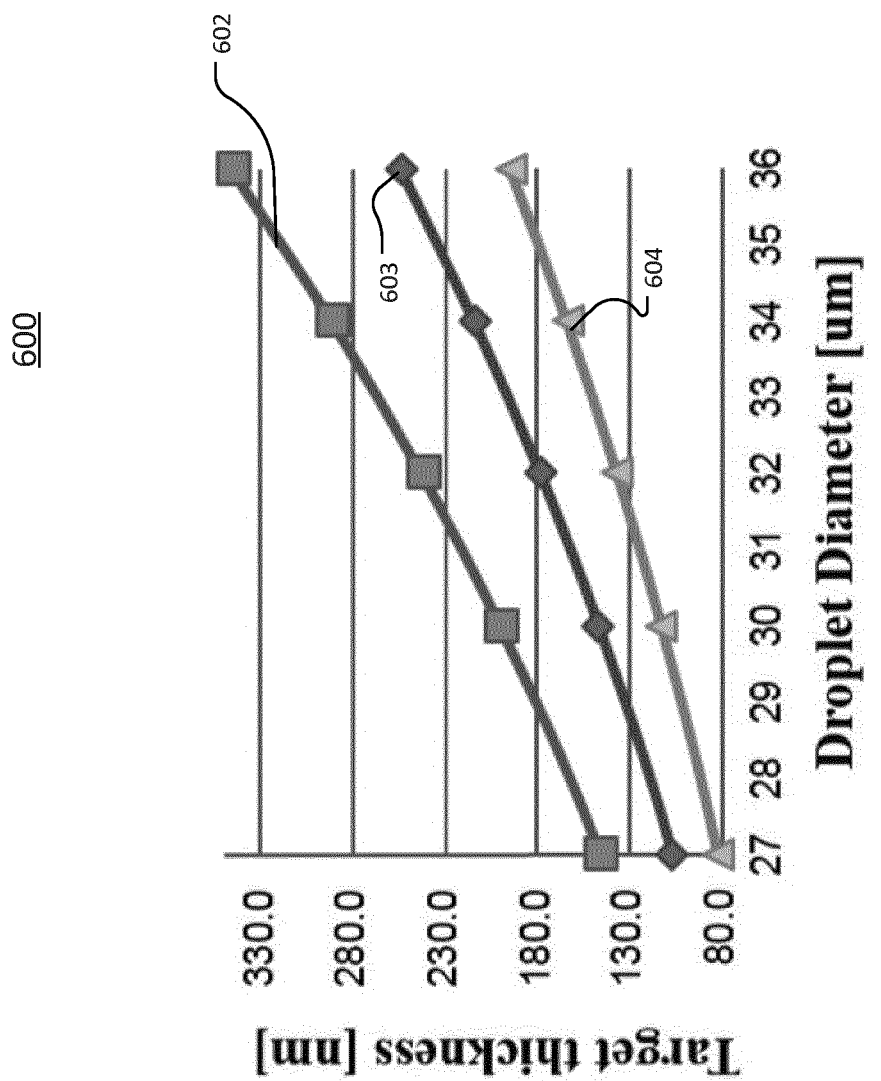
FIG. 6 is an example of measured data relating target thickness to initial target diameter.

FIG. 6 is a graph 600 that shows thickness of a modified target (such as the modified target 221m) along the direction of propagation of the pre-pulse as a function of the diameter of the target droplet emitted from the supply system 110. In the example of FIG. 6, the initial target is a substantially spherical droplet of molten metal. FIG. 6 includes a plot 602, a plot 603, and a plot 604. The plots 602, 603, 604 correspond, respectively, to a modified target that has a diameter of 300 μm, 350 μm, and 400 μm. The diameter of the modified target is along a direction that is different than the direction of propagation and may be along a direction that is generally orthogonal to the direction of propagation. For example, the diameter of the modified target may be in the x-y plane. Although droplets that have a larger diameter may be used to form modified targets that are thicker and larger, as shown in FIG. 6, an initial target having a particular diameter (for example, 27 μm) may be conditioned to form a modified target of various diameters and thicknesses.

Figure 7:
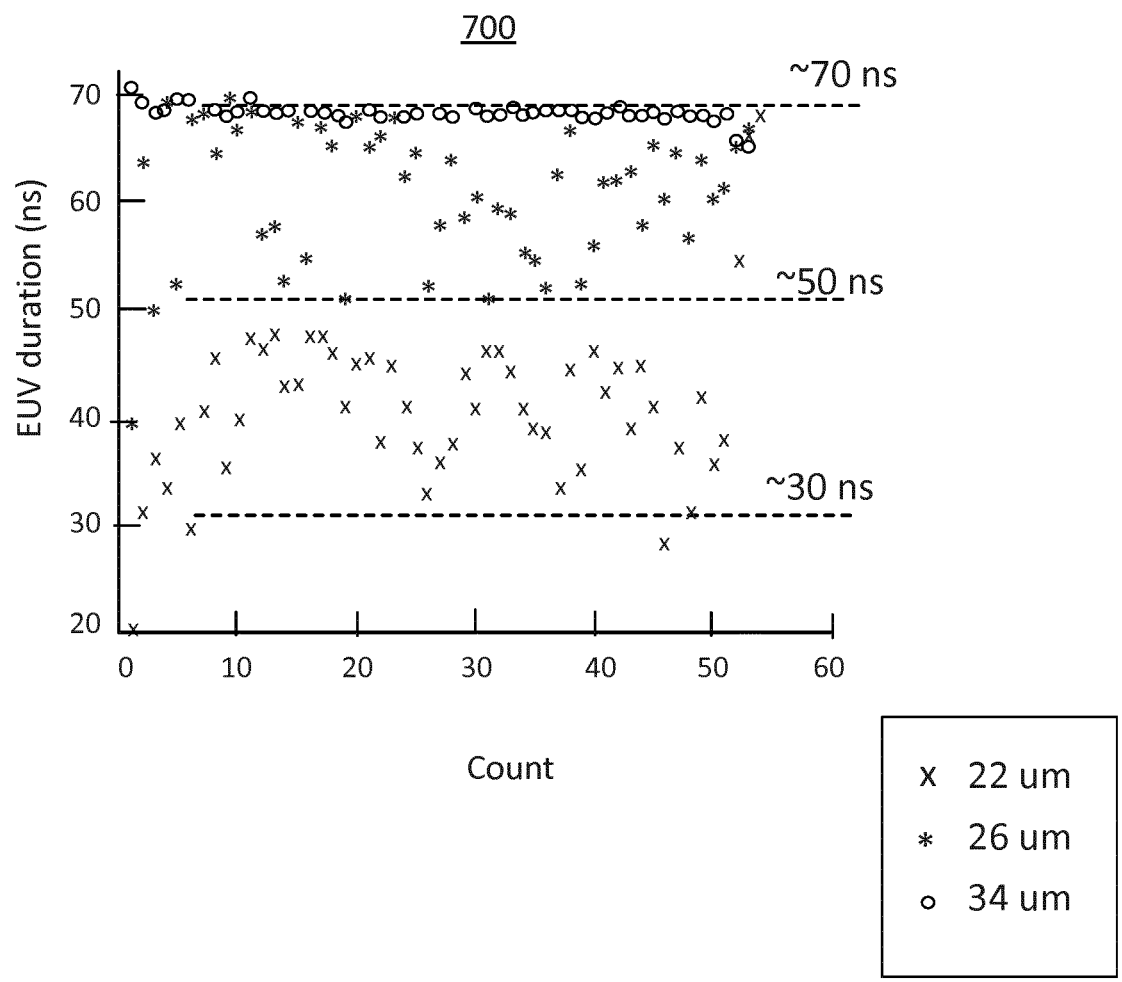
FIG. 7 is an example of measured data relating EUV light duration to a diameter of an initial target.

An optical pulse interacts with the modified target to form plasma, which emits the light. The properties of the emitted light depend on the thickness of the modified target. For example, a relatively thin modified target may reduce the duration of the emission of the light. FIG. 7 is a plot 700 of EUV light duration for a modified target formed from an initial targets having diameters of 22 μm (shown with an "x"), 26 μm (shown with an "*"), and 34 μm (shown with a circle). As shown in FIG. 7, EUV duration is generally longer when using an initial target having a larger diameter (which, as shown in FIG. 6, may be used to form a thicker modified target).

Thus, the thickness of the modified target 221m (FIG. 2) may be used to control the time over which the light 197 (FIG. 2) is emitted. Properties of the modified target 221m, such as the shape (including, for example, the thickness) and density may be controlled by controlling the properties of the pre-pulse 204_2.

The interaction between the pre-pulse 204_2 and the initial target 221p (FIG. 2) forms the modified target 221m. The initial target 221p may be a spherical droplet of target material. However, the interaction between the pre-pulse 204_2 and the initial target 221p modifies a geometric distribution of the target material such that the modified target 221m has a different shape than the initial target 221p. The modified target 221m also may have a different shape than the initial target 221p. For example, the modified target 221m may have a disk shape with the thinnest part of the disk being parallel to the direction of propagation of the main pulse 204_1. In some implementations, the orientation of the modified target 221m may be such that the thinnest part of the modified target 221m is tilted at a non-zero angle relative to the direction of the main pulse 204_1. The modified target 221m may take other geometric forms. For example, in implementations in which the pre-pulse of radiation is less than 1 ns in duration, the modified target 221, can have a shape that is formed from slicing a spheroid along a plane, such as a hemisphere-like shape.

Thus, the shape and/or size of a modified target that arrives in the plasma formation location 123 after the modified target 221m may be controlled by controlling a property of a the pre-pulse that is used to from a subsequent initial target. An example of controlling a property of the pre-pulse in the EUV light source 200 of FIG. 2 is discussed below. In the discussion below, a modified target that arrives in the plasma formation location 123 after the modified target 221m is referred to as a subsequent modified target. A pulse of the optical beam 206_2 that arrives in the initial target region 224 after the pre-pulse 204_2 and at the same time as a subsequent initial target is referred to as a subsequent pre-pulse.

The interaction between the main pulse 204_1 and the modified target 221m forms the plasma 196, which emits the light 197. The sensor system 130 provides information (second data) about the light 197 to the control system 150. The sensor system 130, the optical source 205, and/or the beam delivery system 211_1 provides information about the main pulse 204_1 (first data) to the control system 150. The control system 150 uses the information as discussed with respect to (330) of FIG. 3. If an insufficient amount of target material is converted, the control system 150 may generate a command signal 159 and provide the signal 159 to the optical source 208_2 and/or the beam delivery system 211_2 to change a property of the subsequent pre-pulse. For example, the command signal 159 may change a temporal duration, a rise time, a total energy, and/or a focus position of the subsequent pre-pulse.

By changing one or more of these properties, the subsequent modified target that is formed with the subsequent pre-pulse may be larger in the x-y plane, smaller in the z direction, and/or less dense along the direction of propagation of the subsequent main pulse than the modified target 221m. In this way, the subsequent modified target may absorb more of the subsequent main pulse and may produce less fuel debris in the plasma-generating process.

The properties of a subsequent target may be changed in other ways. For example, the diameter of the initial target 221p may be changed by varying the pressure P that is applied to the reservoir 118 of the supply system 110 and/or by modifying a frequency and/or amplitude of an actuating waveform applied to the supply system 110. Changing the diameter of an initial target 221p may allow the thickness of a modified target formed from that initial target to be changed.

In these implementations, the control system 150 may change the diameter of the initial target 221p by issuing a command signal 159 to the supply system 110. The command signal 159 is sufficient to cause a change within the supply system 110 that changes the diameter of the initial target 221p. Although such changes to the supply system 110 may result in other changes to the stream of targets 121 (for example, distance between targets within the stream and coalescence length), changing one or more parameters of the supply system 110 also may be used to change a property of a subsequent target.

Figure 8:
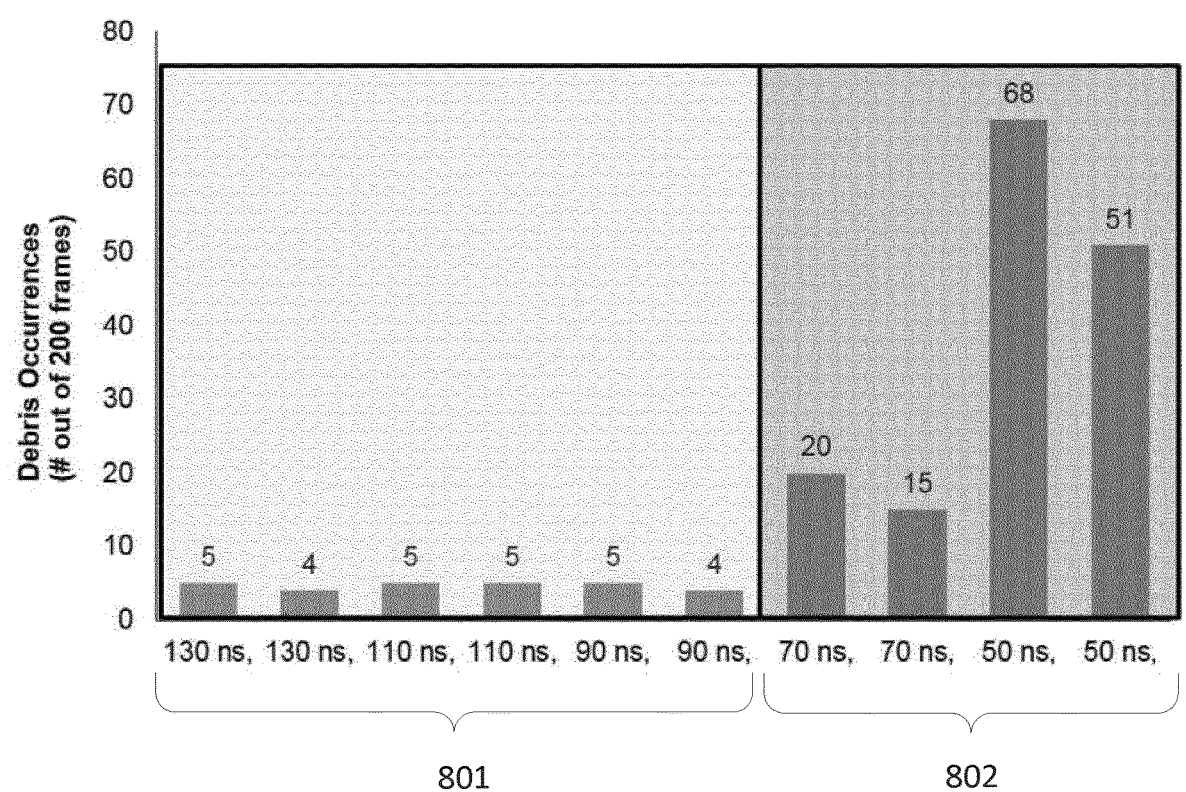

FIG. 8 shows a bar graph 800 of example experimental data. The bar graph 800 shows debris occurrence or debris count as a function of temporal duration of an irradiating optical pulse. The debris count is an indication of the amount of target debris that remains after the plasma-generating event. In the example of FIG. 8, the debris count was measured with a particle image velocimetry (PIV) detector that counts debris particles. The data used to create the bar chart 800 was based on a 27 µm diameter target droplet that had been expanded and arrived at the plasma formation location 123 with a size of 330 µm along the axis of greatest extent.

In FIG. 8, the pulses in the region 801 achieved "burn through" and the pulses in the region 802 did not. The pulses in the region 801 had durations of 130, 110, and 90 nanoseconds (ns). The pulses in the region 802 had durations of 70 ns and 50 ns, which was not sufficiently long to evaporate all of the target material. The debris count was lower for the pulses in the region 801 (for example, a count of 4 or 5) than for the pulses in the region 802 (which had a debris count of at least 15).

In some implementations, data such as shown in FIG. 8 may be collected and stored on the electronic storage 156 of the control system 150 prior to operation of the EUV optical source 100 or 200. The data may be used to program or set an initial pulse duration and/or to control the optical source 105 and/or the beam delivery system 111 during operation to reduce the amount of target debris. For example, the data of FIG. 8 indicates that the temporal duration of the pulse should be 90 ns or greater for a target with a size of 330 µm along the axis of greatest extent reduces the amount of target debris at least by a factor of three.

Figure 9:
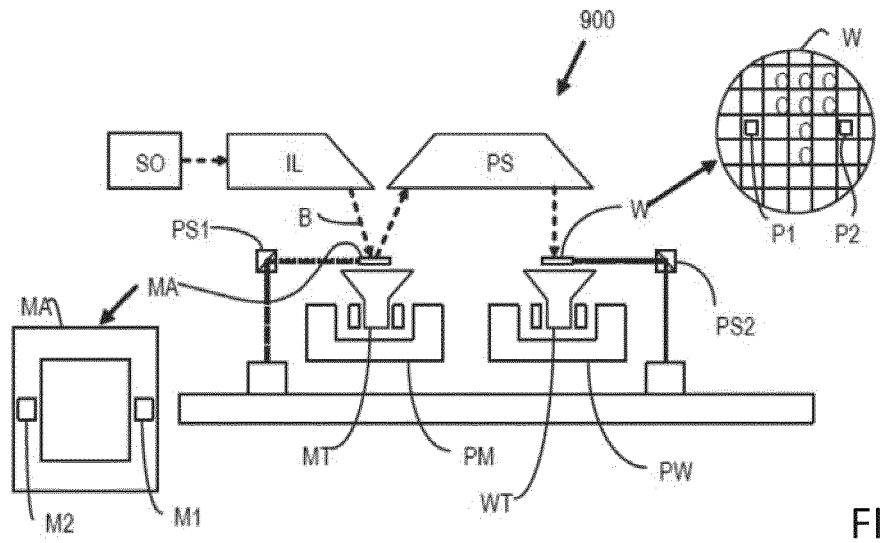
FIG. 9 is a block diagram of an example of a lithographic apparatus.
Figure 10:
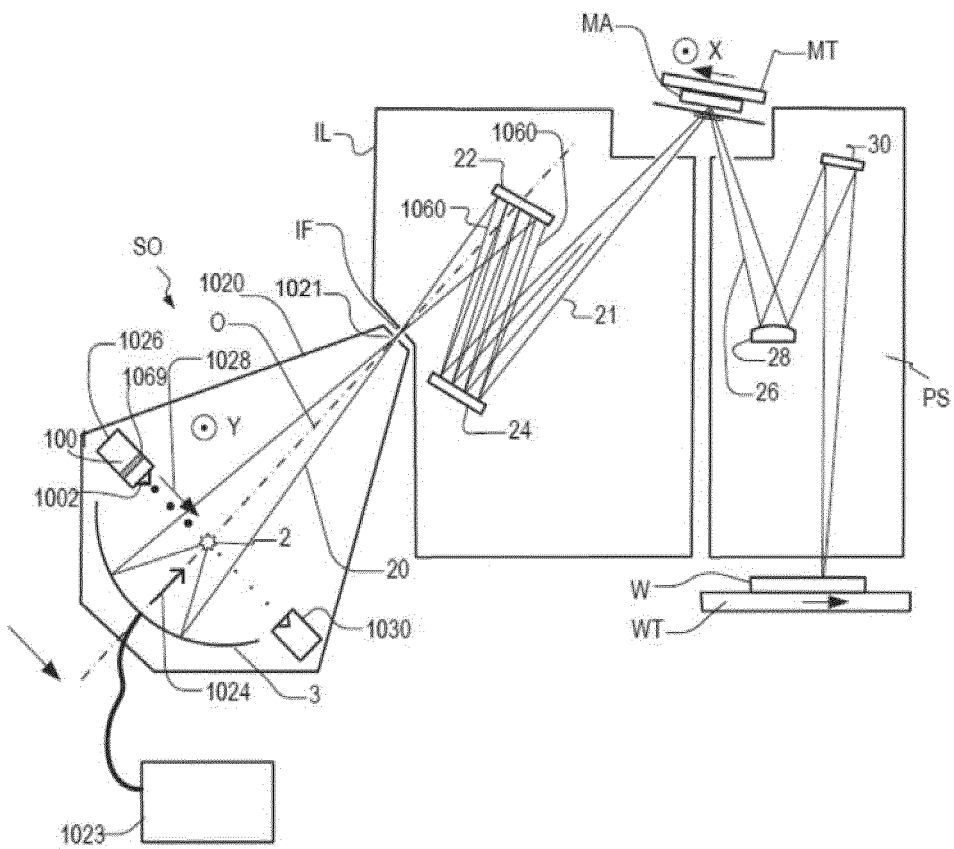
FIG. 10 is a block diagram of an example of an EUV lithographic system.
Figure 11:
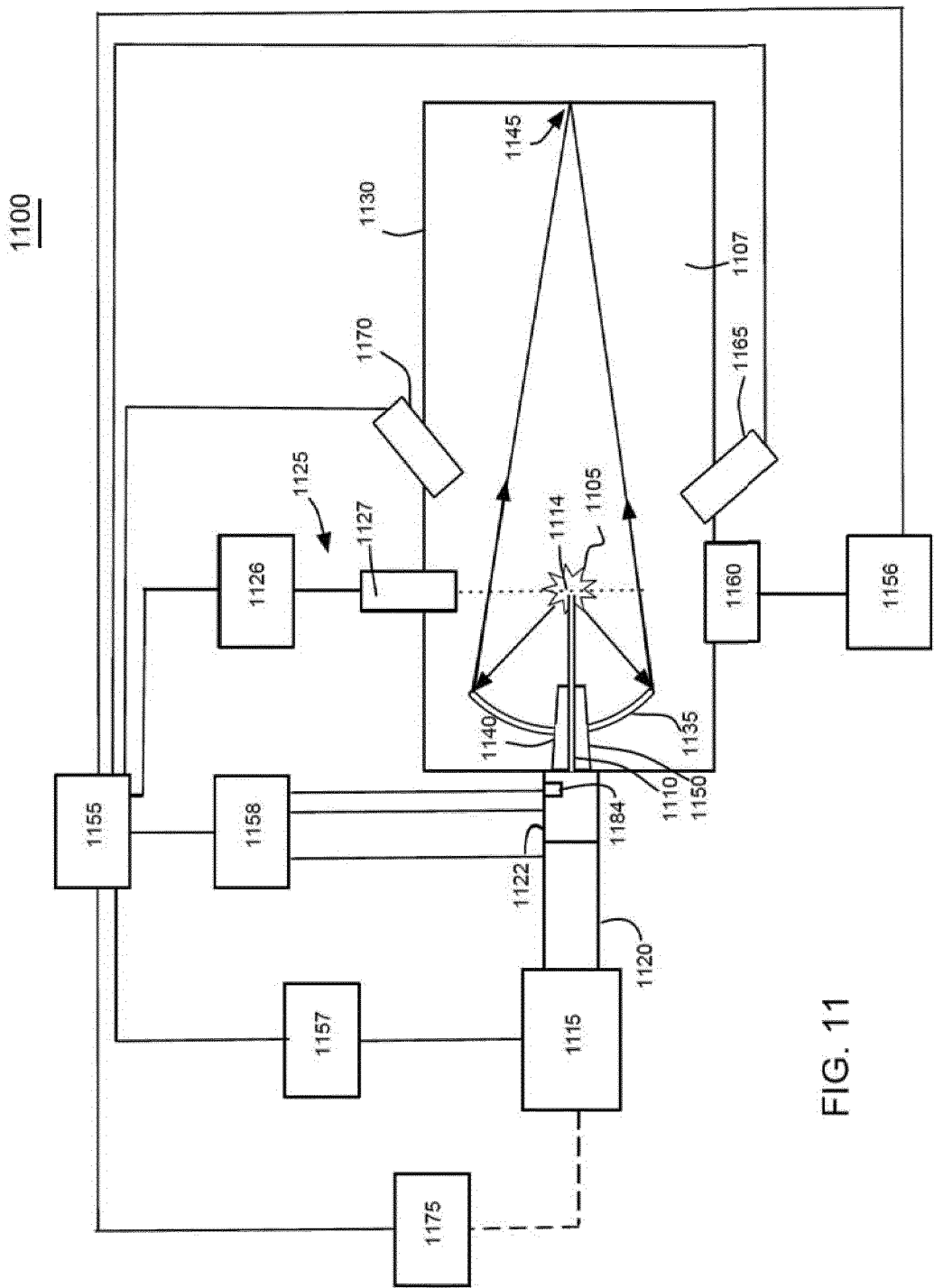
FIG. 11 is a block diagram of an example of an EUV light source.

FIGS. 9 and 10 discuss an example of an EUV photolithography system. FIG. 11 discusses an example of an EUV optical source.

FIG. 9 schematically depicts a lithographic apparatus 900 including a source collector module SO according to one implementation. The lithographic apparatus 900 may be used as the lithography apparatus 199 in the light source 100 or 200. The lithographic apparatus 900 includes:

- an illumination system (illuminator) IL configured to condition a radiation beam B (for example, EUV radiation);
- a support structure (for example, a mask table) MT constructed to support a patterning device (for example, a mask or a reticle) MA and connected to a first positioner PM configured to accurately position the patterning device;
- a substrate table (for example, a wafer table) WT constructed to hold a substrate (for example, a resist-coated wafer) W and connected to a second positioner PW configured to accurately position the substrate; and
- a projection system (for example, a reflective projection system) PS configured to project a pattern imparted to the radiation beam B by patterning device MA onto a target portion C (for example, including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the minor matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (for example, employing a reflective mask). The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 9, the illuminator IL receives an extreme ultraviolet radiation beam from the source collector module SO. Methods to produce EUV light include, but are not necessarily limited to, converting a material into a plasma state that has at least one element, for example, xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 9, for providing the laser beam exciting the fuel. The resulting plasma emits output radiation, for example, EUV radiation, which is collected using a radiation collector, disposed in the source collector module. The laser and the source collector module may be separate entities, for example when a carbon dioxide ($CO_2$) laser is used to provide the laser beam for fuel excitation.

In such cases, the laser is not considered to form part of the lithographic apparatus and the radiation beam is passed from the laser to the source collector module with the aid of a beam delivery system including, for example, suitable directing minors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil minor devices. The illuminator IL may be used to condition the radiation beam, to have a desired uniformity and intensity distribution in its cross-section.

The radiation beam B is incident on the patterning device (for example, mask) MA, which is held on the support structure (for example, mask table) MT, and is patterned by the patterning device. After being reflected from the patterning device (for example, mask) MA, the radiation beam B passes through the projection system PS, which focuses the beam onto a target portion C of the substrate W. With the aid of the second positioner PW and position sensor PS2 (for example, an interferometric device, linear encoder or capacitive sensor), the substrate table WT can be moved accurately, for example, so as to position different target portions C in the path of the radiation beam B. Similarly, the first positioner PM and another position sensor PS1 can be used to accurately position the patterning device (for example mask) MA with respect to the path of the radiation beam B. Patterning device (for example mask) MA and substrate W may be aligned using patterning device alignment marks M1, M2 and substrate alignment marks P1, P2.

The depicted apparatus could be used in at least one of the following modes:

1. In step mode, the support structure (for example, mask table) MT and the substrate table WT are kept essentially stationary, while an entire pattern imparted to the radiation beam is projected onto a target portion C at one time (that is, a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam is projected onto a target portion C (that is, a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

FIG. 10 shows an implementation of the lithographic apparatus 900 in more detail, including the source collector module SO, the illumination system IL, and the projection system PS. The source collector module SO is constructed and arranged such that a vacuum environment can be maintained in an enclosing structure 1020 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 1021 in the enclosing structure 1020. The virtual source point IF is an image of the radiation emitting plasma 2.

From the aperture 1021 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA (as shown by reference 1060). Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the substrate table WT. To expose a target portion C on substrate W, pulses of radiation are generated while substrate table WT and patterning device table MT perform synchronized movements to scan the pattern on patterning device MA through the slit of illumination.

Each system IL and PS is arranged within its own vacuum or near-vacuum environment, defined by enclosing structures similar to enclosing structure 1020. More elements than shown may generally be present in illumination system IL and projection system PS. Further, there may be more minors present than those shown. For example there may be one to six additional reflective elements present in the illumination system IL and/or the projection system PS, besides those shown in FIG. 10.

Considering source collector module SO in more detail, a laser energy source including a laser 1023 is arranged to deposit laser energy 1024 into a fuel that includes a target material. The target material may be any material that emits EUV radiation in a plasma state, such as xenon (Xe), tin (Sn), or lithium (Li). The plasma 2 is a highly ionized plasma with electron temperatures of several 10's of electron volts (eV). Higher energy EUV radiation may be generated with other fuel materials, for example, terbium (Tb) and gadolinium (Gd). The energetic radiation generated during de-excitation and recombination of these ions is emitted from the plasma, collected by a near-normal incidence collector 3 and focused on the aperture 1021. The plasma 2 and the aperture 1021 are located at first and second focal points of collector CO, respectively.

Although the collector 3 shown in FIG. 10 is a single curved minor, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which, for example, is liquid tin, a droplet generator 1026 is arranged within the enclosure 1020, arranged to fire a high frequency stream 1028 of droplets towards the desired location of plasma 2. In operation, laser energy 1024 is delivered in a synchronism with the operation of droplet generator 1026, to deliver impulses of radiation to turn each fuel droplet into a plasma 2. The frequency of delivery of droplets may be several kilohertz, for example 50 kHz. In practice, laser energy 1024 is delivered in at least two pulses: a pre pulse with limited energy is delivered to the droplet before it reaches the plasma location, in order to vaporize the fuel material into a small cloud, and then a main pulse of laser energy 1024 is delivered to the cloud at the desired location, to generate the plasma 2. A trap 1030 is provided on the opposite side of the enclosing structure 1020, to capture fuel that is not, for whatever reason, turned into plasma.

The droplet generator 1026 comprises a reservoir 1001 which contains the fuel liquid (for example, molten tin) and a filter 1069 and a nozzle 1002. The nozzle 1002 is configured to eject droplets of the fuel liquid towards the plasma 2 formation location. The droplets of fuel liquid may be ejected from the nozzle 1002 by a combination of pressure within the reservoir 1001 and a vibration applied to the nozzle by a piezoelectric actuator (not shown).

As the skilled reader will know, reference axes X, Y, and Z may be defined for measuring and describing the geometry and behavior of the apparatus, its various components, and the radiation beams 20, 21, 26. At each part of the apparatus, a local reference frame of X, Y and Z axes may be defined. In the example of FIG. 10, the Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 1028, while the Y axis is orthogonal to that, pointing out of the page as indicated in FIG. 10. On the other hand, in the vicinity of the support structure MT that holds the reticle MA, the X axis is generally transverse to a scanning direction aligned with the Y axis. For convenience, in this area of the schematic diagram FIG. 10, the X axis points out of the page, again as marked. These designations are conventional in the art and will be adopted herein for convenience. In principle, any reference frame can be chosen to describe the apparatus and its behavior.

Numerous additional components used in the operation of the source collector module and the lithographic apparatus 900 as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus 900.

Referring to FIG. 11, an implementation of an LPP EUV optical source 1100 is shown. The optical source 1100 may be used as the source collector module SO in the lithographic apparatus 900. Furthermore, the optical source 105 of FIG. 1A or the optical source 205 of FIG. 2 may be part of the drive laser 1115. The drive laser 1115 may be used as the laser 1023 (FIG. 10).

The LPP EUV optical source 1100 is formed by irradiating a target mixture 1114 at a plasma formation location 1105 with an amplified optical beam 1110 that travels along a beam path toward the target mixture 1114. The targets in the stream 121 discussed with respect to FIG. 1A may be or include the target mixture 1114. The plasma formation location 1105 is within an interior 1107 of a vacuum chamber 1130. When the amplified optical beam 1110 strikes the target mixture 1114, a target material within the target mixture 1114 is converted into a plasma state that has an element with an emission line in the EUV range. The created plasma has certain characteristics that depend on the composition of the target material within the target mixture 1114. These characteristics may include the wavelength of the EUV light produced by the plasma and the type and amount of debris released from the plasma.

The optical source 1100 also includes the supply system 1125 that delivers, controls, and directs the target mixture 1114 in the form of liquid droplets, a liquid stream, solid particles or clusters, solid particles contained within liquid droplets or solid particles contained within a liquid stream. The target mixture 1114 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1114 may also include impurities such as non-target particles. Thus, in the situation in which there are no impurities, the target mixture 1114 is made up of only the target material. The target mixture 1114 is delivered by the supply system 1125 into the interior 1107 of the chamber 1130 and to the plasma formation location 1105.

The optical source 1100 includes a drive laser system 1115 that produces the amplified optical beam 1110 due to a population inversion within the gain medium or mediums of the laser system 1115. The optical source 1100 includes a beam delivery system between the laser system 1115 and the plasma formation location 1105, the beam delivery system including a beam transport system 1120 and a focus assembly 1122. The beam transport system 1120 receives the amplified optical beam 1110 from the laser system 1115, and steers and modifies the amplified optical beam 1110 as needed and outputs the amplified optical beam 1110 to the focus assembly 1122. The focus assembly 1122 receives the amplified optical beam 1110 and focuses the beam 1110 to the plasma formation location 1105.

In some implementations, the laser system 1115 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser minors or other feedback devices that form a laser cavity. Thus, the laser system 1115 produces an amplified optical beam 1110 due to the population inversion in the gain media of the laser amplifiers even if there is no laser cavity. Moreover, the laser system 1115 may produce an amplified optical beam 1110 that is a coherent laser beam if there is a laser cavity to provide enough feedback to the laser system 1115. The term "amplified optical beam" encompasses one or more of: light from the laser system 1115 that is merely amplified but not necessarily a coherent laser oscillation and light from the laser system 1115 that is amplified and is also a coherent laser oscillation.

The optical amplifiers in the laser system 1115 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 1115 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 1115 may also include a cooling system such as water that may be used when operating the laser system 1115 at higher powers.

The optical source 1100 includes a collector minor 1135 having an aperture 1140 to allow the amplified optical beam 1110 to pass through and reach the plasma formation location 1105. The collector mirror 1135 may be, for example, an ellipsoidal minor that has a primary focus at the plasma formation location 1105 and a secondary focus at an intermediate location 1145 (also called an intermediate focus) where the EUV light may be output from the optical source 1100 and may be input to, for example, an integrated circuit lithography tool (not shown). The optical source 1100 may also include an open-ended, hollow conical shroud 1150 (for example, a gas cone) that tapers toward the plasma formation location 1105 from the collector minor 1135 to reduce the amount of plasma-generated debris that enters the focus assembly 1122 and/or the beam transport system 1120 while allowing the amplified optical beam 1110 to reach the plasma formation location 1105. For this purpose, a gas flow may be provided in the shroud that is directed toward the plasma formation location 1105.

The optical source 1100 may also include a master controller 1155 that is connected to a droplet position detection feedback system 1156, a laser control system 1157, and a beam control system 1158. The optical source 1100 may include one or more target or droplet imagers 1160 that provide an output indicative of the position of a droplet, for example, relative to the plasma formation location 1105 and provide this output to the droplet position detection feedback system 1156, which may, for example, compute a droplet position and trajectory from which a droplet position error may be computed either on a droplet by droplet basis or on average. The droplet position detection feedback system 1156 thus provides the droplet position error as an input to the master controller 1155. The master controller 1155 may therefore provide a laser position, direction, and timing correction signal, for example, to the laser control system 1157 that may be used, for example, to control the laser timing circuit and/or to the beam control system 1158 to control an amplified optical beam position and shaping of the beam transport system 1120 to change the location and/or focal power of the beam focal spot within the chamber 1130.

The supply system 1125 includes a target material delivery control system 1126 that is operable, in response to a signal from the master controller 1155, for example, to modify the release point of the droplets as released by a target material supply apparatus 1127 to correct for errors in the droplets arriving at the desired plasma formation location 1105.

Additionally, the optical source 1100 may include optical source detectors 1165 and 1170 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The optical source detector 1165 generates a feedback signal for use by the master controller 1155. The feedback signal may be, for example, indicative of the errors in parameters such as the timing and focus of the laser pulses to properly intercept the droplets in the right place and time for effective and efficient EUV light production.

The optical source 1100 may also include a guide laser 1175 that may be used to align various sections of the optical source 1100 or to assist in steering the amplified optical beam 1110 to the plasma formation location 1105. In connection with the guide laser 1175, the optical source 1100 includes a metrology system 1124 that is placed within the focus assembly 1122 to sample a portion of light from the guide laser 1175 and the amplified optical beam 1110. In other implementations, the metrology system 1124 is placed within the beam transport system 1120. The metrology system 1124 may include an optical element that samples or re-directs a subset of the light, such optical element being made out of any material that may withstand the powers of the guide laser beam and the amplified optical beam 1110. A beam analysis system is formed from the metrology system 1124 and the master controller 1155 since the master controller 1155 analyzes the sampled light from the guide laser 1175 and uses this information to adjust components within the focus assembly 1122 through the beam control system 1158.

Thus, in summary, the optical source 1100 produces an amplified optical beam 1110 that is directed along the beam path to irradiate the target mixture 1114 at the plasma formation location 1105 to convert the target material within the mixture 1114 into plasma that emits light in the EUV range. The amplified optical beam 1110 operates at a particular wavelength (that is also referred to as a drive laser wavelength) that is determined based on the design and properties of the laser system 1115. Additionally, the amplified optical beam 1110 may be a laser beam when the target material provides enough feedback back into the laser system 1115 to produce coherent laser light or if the drive laser system 1115 includes suitable optical feedback to form a laser cavity.

Other implementations are within the scope of the claims. For example, FIGS. 1A, 2, 5A, and 5B show the sensor system 130 as being inside the vacuum chamber 109. However, other implementations are possible. For example, all or part of the sensor system 130 may be outside of the vacuum chamber 109, with the sensor 135 positioned to view an interior of the vacuum chamber 109 through a viewport.

Other aspects of the invention are set out in the following numbered clauses.

1. A method of monitoring an amount of target material converted to a plasma, the method comprising:
   providing an amplified optical beam to a region that receives a target comprising target material, an interaction between the amplified optical beam and the target converting at least some of the target material from a first form to a second form to form a light-emitting plasma;
   accessing first data comprising information related to the amplified optical beam;
   accessing second data comprising information related to the light-emitting plasma; and
   determining an amount of the target material converted from the first form to the second form, wherein the determining is based on at least the first data and the second data, and the second form of the target material is less dense than the first form of the target material.
2. The method of clause 1, wherein the target material comprises a metal, the first form comprises the metal in a molten form, and the second form comprises the metal in a vaporized form.
3. The method of clause 1, further comprising adjusting either or both of a property of the amplified optical beam and a property of at least one subsequent target based on the determined amount of converted target material, the at least one subsequent target being received at the region after the target.
4. The method of clause 3, wherein the amplified optical beam comprises a pulsed amplified optical beam, the pulsed amplified optical beam comprises a plurality of pulses of light, and the light-emitting plasma is formed by an interaction between one of the plurality of pulses of light and the target material.
5. The method of clause 4, wherein the one of the plurality of pulses of light has a temporal duration, and the light-emitting plasma formed by the interaction between the one of the plurality of pulses of light and the target emits light during a light-emission period.
6. The method of clause 5, wherein
   the first data comprises information representing a temporal duration of the one of the plurality of pulses of light, and
   the second data comprises information representing a temporal duration of the light-emission period.
7. The method of clause 6, wherein determining an amount of conversion of the target material comprises:
   comparing the temporal duration of one of the plurality of pulses of light and the temporal duration of the light-emission period to determine a ratio of the temporal duration of the light-emission period to the temporal duration of one of the plurality of pulses;
   comparing the ratio to a threshold ratio, the threshold ratio being a value above which production of target debris is unacceptable; and
   determining whether the ratio is greater than the threshold ratio based on the comparison.
8. The method of clause 7, further comprising, if the ratio is greater than the threshold ratio, adjusting a property of a subsequent pulse in the amplified optical beam or deactivating a source that produces the amplified optical beam.
9. The method of clause 8, wherein the property of the subsequent pulse includes one or more of a temporal duration, a temporal profile, an energy, and a focus location.
10. The method of clause 8, wherein the subsequent pulse is the pulse that immediately follows the one of the plurality of pulses.
11. The method of clause 7, further comprising, if the ratio is greater than the threshold ratio, adjusting a property of a subsequent target, the subsequent target being received at the region after the target, or deactivating a source that produces the amplified optical beam.
12. The method of clause 11, wherein the property of the subsequent target comprises one or more of a shape, a density, a thickness, and a size.
13. The method of clause 1, wherein
   the information related to the amplified optical beam comprises information representing a property of the one of the plurality of pulses of light,
   the information related to the light-emitting plasma comprises information representing a property of the light-emission period,
   determining an amount of conversion of the target material comprises comparing the property of the one of the plurality of pulses of light and the property of the light-emission period, and
   the property of the one of the plurality of pulses of light and the property of the light-emitting plasma comprises a rise time, a peak energy value, a total energy content, and/or an average energy content.
14. The method of clause 1, wherein
   the first data comprises data from a first sensor, the first sensor being configured to measure a property of the amplified optical beam and to generate the information related to the amplified optical beam based on the measured property of the amplified optical beam, and
   the second data comprises data from a second sensor, the second sensor being configured to measure a property of the light-emitting plasma and to generate the information related to the light-emitting plasma based on the measured property of the light-emitting plasma.
15. The method of clause 1, further comprising presenting diagnostic data based on the on the determined amount of conversion of the target material.
16. The method of clause 1, further comprising controlling a source of the amplified optical beam based on the determined amount of conversion of the target material, wherein controlling the source of the amplified optical beam comprises (a) deactivating the source, (b) changing an operating mode of the source, or (c) triggering an optimization routine in the source.
17. The method of clause 1, wherein the second data comprises information about extreme ultraviolet (EUV) light emitted from the light-emitting plasma.

18. The method of clause 1, wherein determining the amount of target material converted comprises determining production of target debris and/or particulate debris, the target debris comprising target material in the first form and the particulate debris comprising target material in the second form.

19. A system comprising:
an optical source configured to emit an amplified optical beam;
a vacuum chamber positioned to receive the amplified optical beam at a plasma formation location in an interior of the vacuum chamber;
a target material supply system configured to provide a target comprising target material to the plasma formation location, wherein an interaction between the target and the amplified optical beam converts at least some of the target material to form a light-emitting plasma;
a sensor system comprising:
a first sensor configured to detect least one wavelength of the amplified optical beam and to produce a first signal, the first signal comprising information related to the amplified optical beam;
a second sensor configured to detect at least some of the light emitted from the light-emitting plasma and to produce a second signal, the second signal comprising information related to the light-emitting plasma; and
a control system coupled to the sensor system, the control system configured to determine an amount of conversion of the target material based on at least the first signal and the second signal.

20. The system of clause 19, wherein the control system is further configured to control one or more properties of the amplified optical beam based on the determined amount of conversion.

21. The system of clause 20, wherein the optical source is configured to emit a pulsed amplified optical beam, the first signal comprises information that indicates a temporal duration of a pulse of light emitted from the optical source, and the second signal comprises information that indicates a duration of light emission from the plasma.

22. The system of clause 21, wherein the system further comprises an optical modulator between the optical source and the target region, and wherein the control system is coupled to the optical modulator, and the control system is configured to control a property of the amplified optical beam by controlling the optical modulator to thereby control a temporal duration of the amplified optical beam.

23. The system of clause 19, wherein the control system is coupled to the optical source, and the control system is further configured to control the optical source based on the determined amount of conversion.

24. The system of clause 19, wherein the system further comprises a second optical source, the second optical source configured to emit a second optical beam, and wherein, in operational use, the second optical beam irradiates the target to form a modified target, and the interaction between the amplified optical beam and the target comprises an interaction between the amplified optical beam and the modified target.

25. The system of clause 24, wherein the property of the target comprises one or more of a density, a size, a thickness, and a shape.

26. The system of clause 24, wherein the control system is coupled to the second optical source and is further configured to control one or more properties of the second optical beam based on the determined amount of conversion.

27. The system of clause 26, wherein the properties of the second optical beam comprise one or more of an energy, a temporal duration of a pulse, a temporal profile of a pulse, and a focus position.

28. The system of clause 19, wherein the second sensor comprises a sensing element configured to detect EUV light.

29. A control system for an EUV optical source, the control system comprising:
one or more electronic processors; and
an electronic storage coupled to the one or more electronic processors, the electronic storage comprising instructions that, when executed, cause the one or more electronic processors to:
access first data comprising information related to an amplified optical beam, the amplified optical beam being configured to interact with a target material in a target to form a light-emitting plasma in a vacuum vessel of the EUV optical source;
access second data comprising information related to the light-emitting plasma;
determine an amount of the target material converted from a first form of the target material to a second form of the target material in the interaction based at least on the first data and the second data;
compare the determined amount of target material converted in the interaction to a threshold amount of conversion; and
if the amount of target material converted in the interaction is less than the threshold amount of conversion, generate a command signal, the command signal being sufficient to control one or more of an optical source and an optical component.

Other implementations are within the scope of the following claims.

What is claimed is:
1. A method of monitoring an amount of target material converted to a light-emitting plasma, the method comprising:
providing an amplified optical beam to a region that receives a target comprising target material, an interaction between the amplified optical beam and the target converting at least some of the target material to the light-emitting plasma, wherein the light-emitting plasma is less dense than the target material;
accessing first data comprising information related to the amplified optical beam;
accessing second data comprising information related to the light-emitting plasma; and
determining an amount of the target material converted to the light-emitting plasma, wherein the determining is based on at least the first data and the second data.

2. The method of claim 1, wherein the target material comprises a metal in a molten form.

3. The method of claim 1, further comprising adjusting either or both of a property of the amplified optical beam and a property of at least one subsequent target based on the determined amount of converted target material, the at least one subsequent target being received at the region after the target.

4. The method of claim 3, wherein the amplified optical beam comprises a pulsed amplified optical beam, the pulsed amplified optical beam comprises a plurality of pulses of light, and the light-emitting plasma is formed by an interaction between one of the plurality of pulses of light and the target material.

5. The method of claim 4, wherein the one of the plurality of pulses of light has a temporal duration, and the light-emitting plasma formed by the interaction between the one of the plurality of pulses of light and the target emits light during a light-emission period.

6. A method of monitoring an amount of target material converted to a light-emitting plasma, the method comprising:
providing a pulsed amplified optical beam comprising a plurality of pulses of light to a region that receives a target comprising target material, wherein an interaction between one of the pulses of light and the target converts at least some of the target material from a first form to a second form to form the light-emitting plasma that emits light during a light-emission period and wherein the second form of the target material is less dense than the first form of the target material;
accessing first data comprising information representing a temporal duration of the one of the pulses of light;
accessing second data comprising information representing a temporal duration of the light-emission period; and
determining an amount of the target material converted from the first form to the second form, wherein determining is based on at least the first and the second data.

7. The method of claim 6, wherein determining an amount of conversion of the target material comprises:
comparing the temporal duration of one of the plurality of pulses of light and the temporal duration of the light-emission period to determine a ratio of the temporal duration of the light-emission period to the temporal duration of one of the plurality of pulses;
comparing the ratio to a threshold ratio, the threshold ratio being a value above which production of target debris is unacceptable; and
determining whether the ratio is greater than the threshold ratio based on the comparison.

8. The method of claim 7, further comprising, if the ratio is greater than the threshold ratio, adjusting a property of a subsequent pulse in the amplified optical beam or deactivating a source that produces the amplified optical beam.

9. The method of claim 8, wherein the property of the subsequent pulse includes one or more of a temporal duration, a temporal profile, an energy, and a focus location.

10. The method of claim 8, wherein the subsequent pulse is the pulse that immediately follows the one of the plurality of pulses.

11. The method of claim 7, further comprising, if the ratio is greater than the threshold ratio, adjusting a property of a subsequent target, the subsequent target being received at the region after the target, or deactivating a source that produces the amplified optical beam.

12. The method of claim 11, wherein the property of the subsequent target comprises one or more of a shape, a density, a thickness, and a size.

13. The method of claim 1, wherein
the information related to the amplified optical beam comprises information representing a property of the one of the plurality of pulses of light,
the information related to the light-emitting plasma comprises information representing a property of the light-emission period,
determining an amount of conversion of the target material comprises comparing the property of the one of the plurality of pulses of light and the property of the light-emission period, and
the property of the one of the plurality of pulses of light and the property of the light-emitting plasma comprises a rise time, a peak energy value, a total energy content, and/or an average energy content.

14. The method of claim 1, wherein
the first data comprises data from a first sensor, the first sensor being configured to measure a property of the amplified optical beam and to generate the information related to the amplified optical beam based on the measured property of the amplified optical beam, and
the second data comprises data from a second sensor, the second sensor being configured to measure a property of the light-emitting plasma and to generate the information related to the light-emitting plasma based on the measured property of the light-emitting plasma.

15. The method of claim 1, further comprising presenting diagnostic data based on the on the determined amount of conversion of the target material.

16. The method of claim 1, further comprising controlling a source of the amplified optical beam based on the determined amount of conversion of the target material, wherein controlling the source of the amplified optical beam comprises (a) deactivating the source, (b) changing an operating mode of the source, or (c) triggering an optimization routine in the source.

17. The method of claim 1, wherein the second data comprises information about extreme ultraviolet (EUV) light emitted from the light-emitting plasma.

18. The method of claim 1, wherein determining the amount of target material converted comprises determining production of target debris and/or particulate debris, the target debris comprising particles or pieces of the target material and the particulate debris comprising vaporized, atomized, and/or ionized particles of the target material.

19. A system comprising:
an optical source configured to emit an amplified optical beam;
a vacuum chamber positioned to receive the amplified optical beam at a plasma formation location in an interior of the vacuum chamber;
a target material supply system configured to provide a target comprising target material to the plasma formation location, wherein an interaction between the target and the amplified optical beam converts at least some of the target material to a light-emitting plasma;
a sensor system comprising:
a first sensor configured to detect least one wavelength of the amplified optical beam and to produce a first signal, the first signal comprising information related to the amplified optical beam;
a second sensor configured to detect at least some of the light emitted from the light-emitting plasma and to produce a second signal, the second signal comprising information related to the light-emitting plasma; and
a control system coupled to the sensor system, the control system configured to determine an amount of conversion of the target material into the light-emitting plasma based on at least the first signal and the second signal.

20. The system of claim 19, wherein the control system is further configured to control one or more properties of the amplified optical beam based on the determined amount of conversion.

21. The system of claim 20, wherein the optical source is configured to emit a pulsed amplified optical beam, the first signal comprises information that indicates a temporal duration of a pulse of light emitted from the optical source, and the second signal comprises information that indicates a duration of light emission from the plasma.

22. The system of claim 21, wherein the system further comprises an optical modulator between the optical source and the target region, and wherein the control system is coupled to the optical modulator, and the control system is configured to control a property of the amplified optical beam by controlling the optical modulator to thereby control a temporal duration of the amplified optical beam.

23. The system of claim 19, wherein the control system is coupled to the optical source, and the control system is further configured to control the optical source based on the determined amount of conversion.

24. The system of claim 19, wherein the system further comprises a second optical source, the second optical source configured to emit a second optical beam, and wherein, in operational use, the second optical beam irradiates the target to form a modified target, and the interaction between the amplified optical beam and the target comprises an interaction between the amplified optical beam and the modified target.

25. The system of claim 24, wherein the property of the target comprises one or more of a density, a size, a thickness, and a shape.

26. The system of claim 24, wherein the control system is coupled to the second optical source and is further configured to control one or more properties of the second optical beam based on the determined amount of conversion.

27. The system of claim 26, wherein the properties of the second optical beam comprise one or more of an energy, a temporal duration of a pulse, a temporal profile of a pulse, and a focus position.

28. The system of claim 19, wherein the second sensor comprises a sensing element configured to detect EUV light.

29. A control system for an EUV optical source, the control system comprising:
one or more electronic processors; and
an electronic storage coupled to the one or more electronic processors, the electronic storage comprising instructions that, when executed, cause the one or more electronic processors to:
access first data comprising information related to an amplified optical beam, the amplified optical beam being configured to interact with a target material in a target to form a light-emitting plasma in a vacuum vessel of the EUV optical source;
access second data comprising information related to the light-emitting plasma;
determine an amount of the target material converted to the light-emitting plasma due to the interaction based at least on the first data and the second data;
compare the determined amount of target material converted to the light-emitting plasma to a threshold amount of conversion; and
if the amount of target material converted to the light-emitting plasma is less than the threshold amount of conversion, generate a command signal, the command signal being sufficient to control one or more of an optical source and an optical component.

* * * * *